(12) United States Patent
Darwish et al.

(10) Patent No.: US 9,847,413 B2
(45) Date of Patent: Dec. 19, 2017

(54) DEVICES, COMPONENTS AND METHODS COMBINING TRENCH FIELD PLATES WITH IMMOBILE ELECTROSTATIC CHARGE

(71) Applicant: MaxPower Semiconductor Inc., San Jose, CA (US)

(72) Inventors: Mohamed N. Darwish, Campbell, CA (US); Jun Zeng, Torrance, CA (US)

(73) Assignee: MaxPower Semiconductor Inc., San Jose, CA (US)

( * ) Notice: Subject to any disclaimer, the term of this patent is extended or adjusted under 35 U.S.C. 154(b) by 0 days.

(21) Appl. No.: 15/230,307

(22) Filed: Aug. 5, 2016

(65) Prior Publication Data

US 2016/0343849 A1 Nov. 24, 2016

Related U.S. Application Data

(63) Continuation of application No. 14/840,744, filed on Aug. 31, 2015, now Pat. No. 9,419,084, which is a continuation of application No. 13/975,421, filed on Aug. 26, 2013, now Pat. No. 9,129,936, which is a
(Continued)

(51) Int. Cl.
| | |
|---|---|
| *H01L 29/66* | (2006.01) |
| *H01L 29/78* | (2006.01) |
| *H01L 29/10* | (2006.01) |
| *H01L 29/40* | (2006.01) |
| *H01L 29/423* | (2006.01) |
| *H01L 29/16* | (2006.01) |
| *H03K 17/687* | (2006.01) |
| *H01L 29/06* | (2006.01) |

(Continued)

(52) U.S. Cl.
CPC ...... *H01L 29/7811* (2013.01); *H01L 29/0638* (2013.01); *H01L 29/0649* (2013.01); *H01L 29/0696* (2013.01); *H01L 29/0856* (2013.01); *H01L 29/0882* (2013.01); *H01L 29/1095* (2013.01); *H01L 29/16* (2013.01); *H01L 29/404* (2013.01); *H01L 29/407* (2013.01); *H01L 29/408* (2013.01); *H01L 29/4236* (2013.01); *H01L 29/42376* (2013.01); *H01L 29/7813* (2013.01); *H01L 29/7823* (2013.01); *H01L 29/7827* (2013.01); *H01L 29/7835* (2013.01); *H03K 17/687* (2013.01); *H01L 29/0634* (2013.01); *H01L 29/0692* (2013.01); *H01L 29/0847* (2013.01); *H01L 29/0878* (2013.01); *H01L 29/41766* (2013.01); *H01L 29/42368* (2013.01)

(58) Field of Classification Search
None
See application file for complete search history.

(56) References Cited

U.S. PATENT DOCUMENTS 8,546,893 B2 * 10/2013 Darwish ............. H01L 29/0638
257/329

* cited by examiner

*Primary Examiner* — Cory Eskridge
(74) *Attorney, Agent, or Firm* — Groover & Associates PLLC; Robert O. Groover III; Gwendolyn G. Corcoran

(57) ABSTRACT

N-channel power semiconductor devices in which an insulated field plate is coupled to the drift region, and immobile electrostatic charge is also present at the interface between the drift region and the insulation around the field plate. The electrostatic charge permits OFF-state voltage drop to occur near the source region, in addition to the voltage drop which occurs near the drain region (due to the presence of the field plate).

8 Claims, 33 Drawing Sheets

Related U.S. Application Data continuation of application No. 13/004,054, filed on Jan. 11, 2011, now Pat. No. 8,546,893.

(60) Provisional application No. 61/294,427, filed on Jan. 12, 2010, provisional application No. 61/307,007, filed on Feb. 23, 2010.

(51) Int. Cl.
*H01L 29/08* (2006.01)
*H01L 29/417* (2006.01)

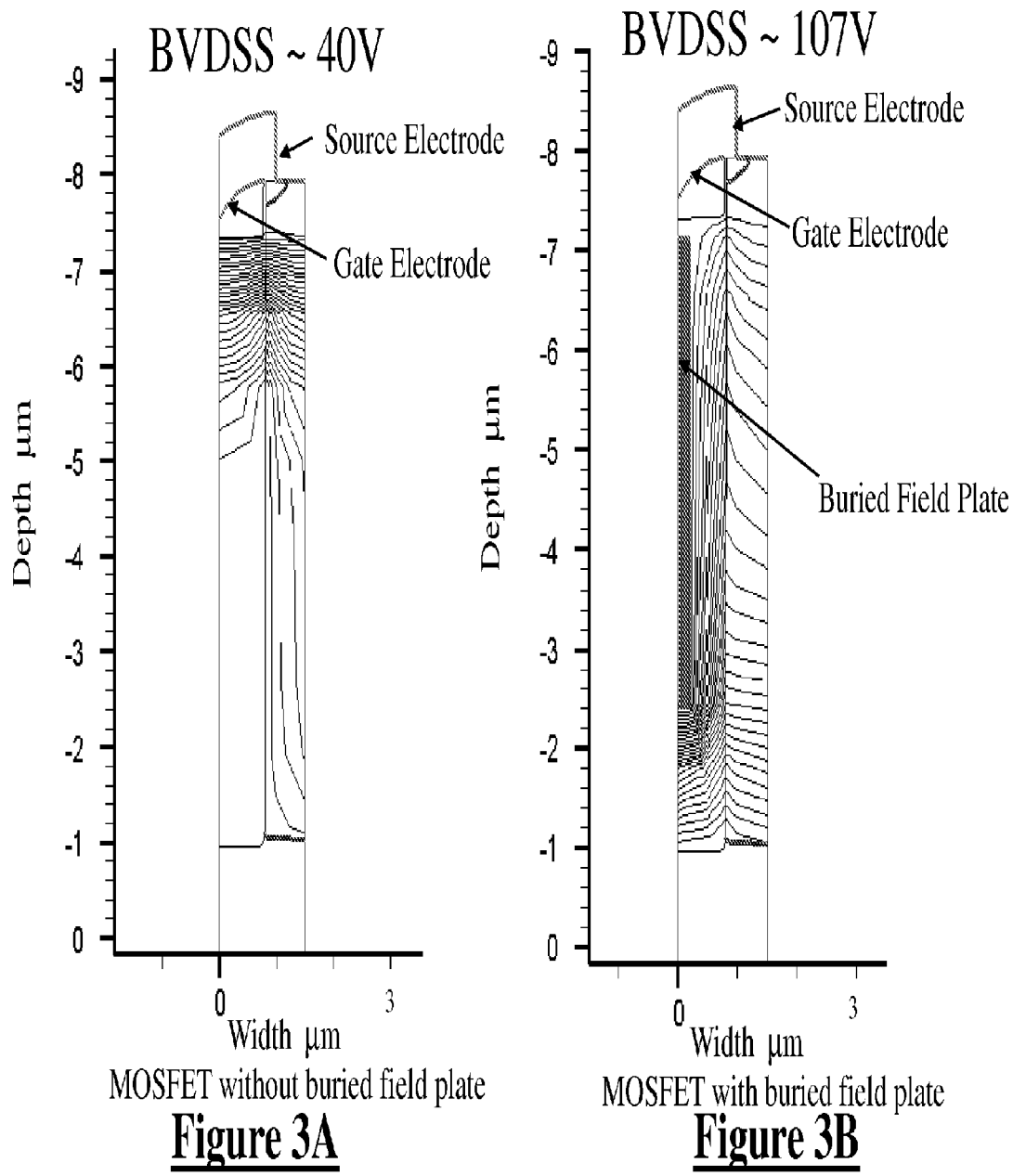
Figure 3A — MOSFET without buried field plate
Figure 3B — MOSFET with buried field plate

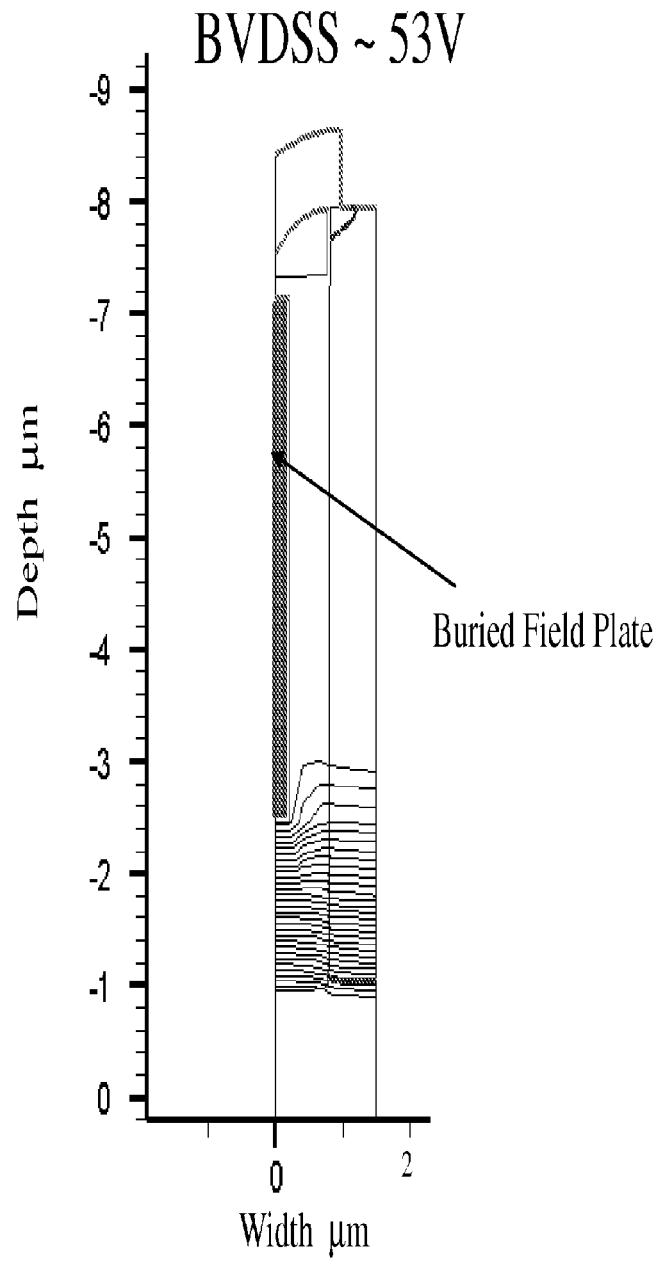
Figure 3C  MOSFET with buried field plate and low QF

Potential and Electric Field along oxide-silicon interface $Q_F$=2.2e12 cm$^{-2}$ Electric potential vs. depth Electric Field vs. depth Potential and Electric Field along oxide-silicon interface $Q_F = 1e10 \text{ cm}^{-2}$ Electric potential vs. depth μm Electric Field vs. depth μm

DEVICES, COMPONENTS AND METHODS COMBINING TRENCH FIELD PLATES WITH IMMOBILE ELECTROSTATIC CHARGE

CROSS-REFERENCE

Priority is claimed from U.S. patent application 61/294,427 filed Jan. 12, 2010, which is hereby incorporated by reference, and also from U.S. patent application 61/307,007 filed Feb. 23, 2010, which is also hereby incorporated by reference.

BACKGROUND

The present application relates to semiconductor devices, and particularly to power semiconductor devices which use intentionally introduced permanent electrostatic charge in trenches which adjoin regions where current flows in the ON state.

Note that the points discussed below may reflect the hindsight gained from the disclosed inventions, and are not necessarily admitted to be prior art.

Power MOSFETs are widely used as switching devices in many electronic applications. In order to minimize the conduction power loss it is desirable that power MOSFETs have a low specific on-resistance ($R_{SP}$ or R*A), which is defined as the product of the on-resistance of the MOSFET multiplied by the active die area. In general, the on-resistance of a power MOSFET is dominated by the channel resistance and the drift region resistances which include the substrate resistance, spreading resistance and the epitaxial (epi) layer resistance.

Recently, the so called super-junction structure has been developed to reduce the drift region resistance. The super-junction structure consists of alternating highly doped p-type and n-type pillars or layers. For a given breakdown voltage, the doping concentrations of n-type pillar (the n-type drift region) can be one order of magnitude higher than that of conventional drift region provided that the total charge of n-type pillar is designed to be balanced with charge in the p-type pillar. In order to fully realize the benefits of the super-junction, it is desirable to increase the packing density of the pillars to achieve a lower $R_{SP}$. However, the minimum pillar widths that can be attained in practical device manufacturing set a limitation on the reducing the cell pitch and scaling the device.

Recently, inventions (see for example US application 20080191307 and US application 20080164518) have been disclosed to address this issue by incorporating fixed or permanent positive charge ($Q_F$) to balance the charge of a p-type pillar in a diode or voltage blocking structure. The permanent charge can also form an electron drift region in a power MOSFET, by forming an inversion layer along the interface between the oxide and P epi layer. By making use of that concept, the area scaling limitation due to inter-diffusion of p-type pillar and n-type pillar was mitigated. Consequently, a small cell pitch and high packing density of pillars and channels was achieved, reducing the device total on-resistance (and specific on-resistance $R_{SP}$). In addition, the structure of FIG. 2 has a key advantage over conventional super-junction devices in that there is no JFET effect to limit the current so smaller cell pitches are highly desirable.

SUMMARY

The present inventors have realized that there are several different device structures that can use higher $Q_F$ than that of the device structure shown in FIG. 2 without degrading breakdown voltage. Thus, among other teachings, the present application describes some ways to reduce the specific on-resistance $R_{SP}$, for a given breakdown voltage specification, by actually increasing the maximum breakdown voltage.

In one class of embodiments, this is done by introducing a buried field plate inside the trench. Several techniques are disclosed for achieving this.

The disclosed innovations, in various embodiments, provide one or more of at least the following advantages. However, not all of these advantages result from every one of the innovations disclosed, and this list of advantages does not limit the various claimed inventions.

Lower specific on-resistance $R_{SP}$;
Lower gate-drain charge Cgd.
Improved manufacturability.
Higher breakdown voltage
charge balancing;
uniform electric fields.
Improved quality control.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 3A-3G show two-dimensional device simulations potential contour at avalanche breakdown results of the MOSFET structures shown in FIG. 1 and FIG. 2, together with plots of voltage and electric field versus depth

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application describes several new device and fabrication concepts, and many different ways to implement them. A number of these concepts and embodiments will be described in detail, but it must be remembered that the new concepts described here include some very broadly applicable points.

The present inventors have realized that it is possible to reduce the specific on-resistance $R_{SP}$ by increasing the permanent charge $Q_F$, while ALSO still meeting the required breakdown voltage. It is also possible, and desirable, to reduce the intrinsic capacitances of the device such as gate-to-drain capacitance (Cgd).

Figure 2:
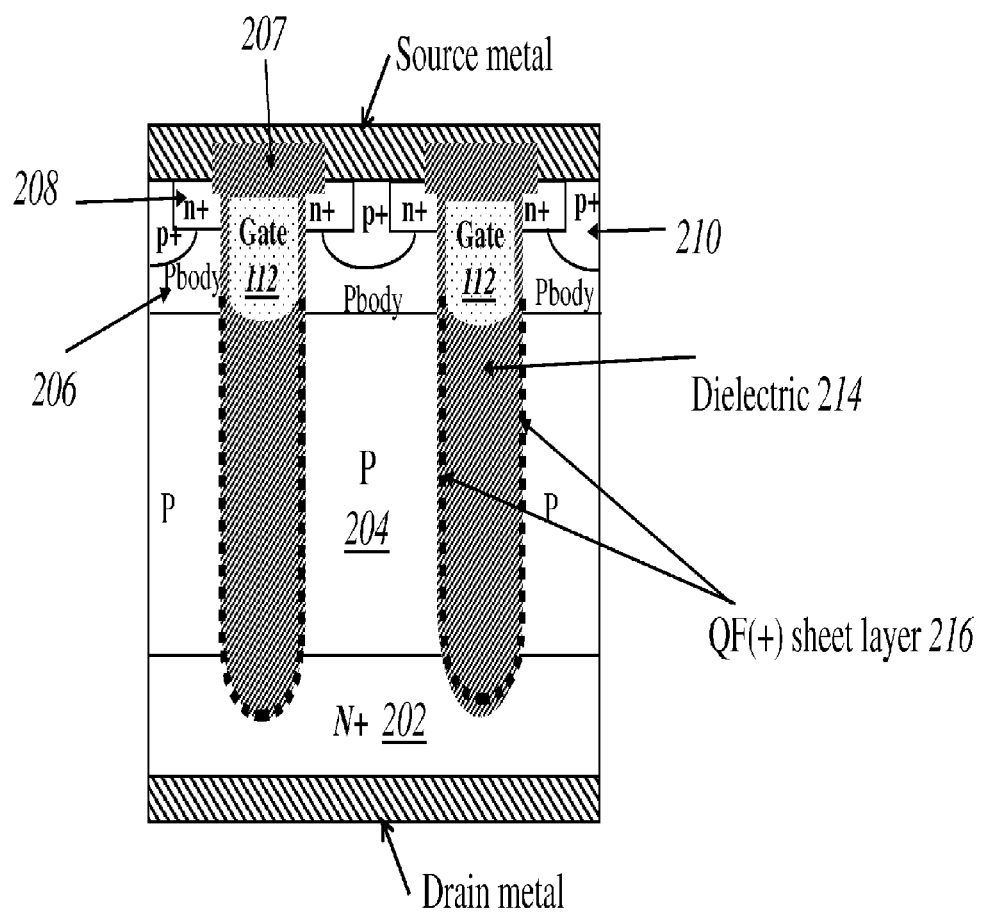
FIG. 2 schematically shows a MOSFET structure previously proposed by ones of the present inventors, in which a fixed or permanent positive charge ($Q_F$).

FIG. 2 shows one example of a trench transistor as described in the published applications referenced above. Here insulated gate electrodes 212 are present in the upper parts of trenches 207, and the semiconductor structure near the front surface includes a p-type body region 206 which is contacted by a p+ body contact diffusion 210, as well as an n+ source region 208. Positive permanent charge 216 is present near the trench sidewalls, and provides improved charge balancing when the epitaxial layer 204 is depleted under reverse bias. The permanent charge also forms an induced drift region by forming an inversion layer along the interface between the oxide and the P-type layer. Using this concept, the scaling limitation due to inter-diffusion of p-type pillar and n-type pillar can be eliminated. Consequently, a small cell pitch and high packing density of pillars (and of channel area) can be realized, to thereby reduce the device total on resistance and $R_{SP}$.

Figure 1:
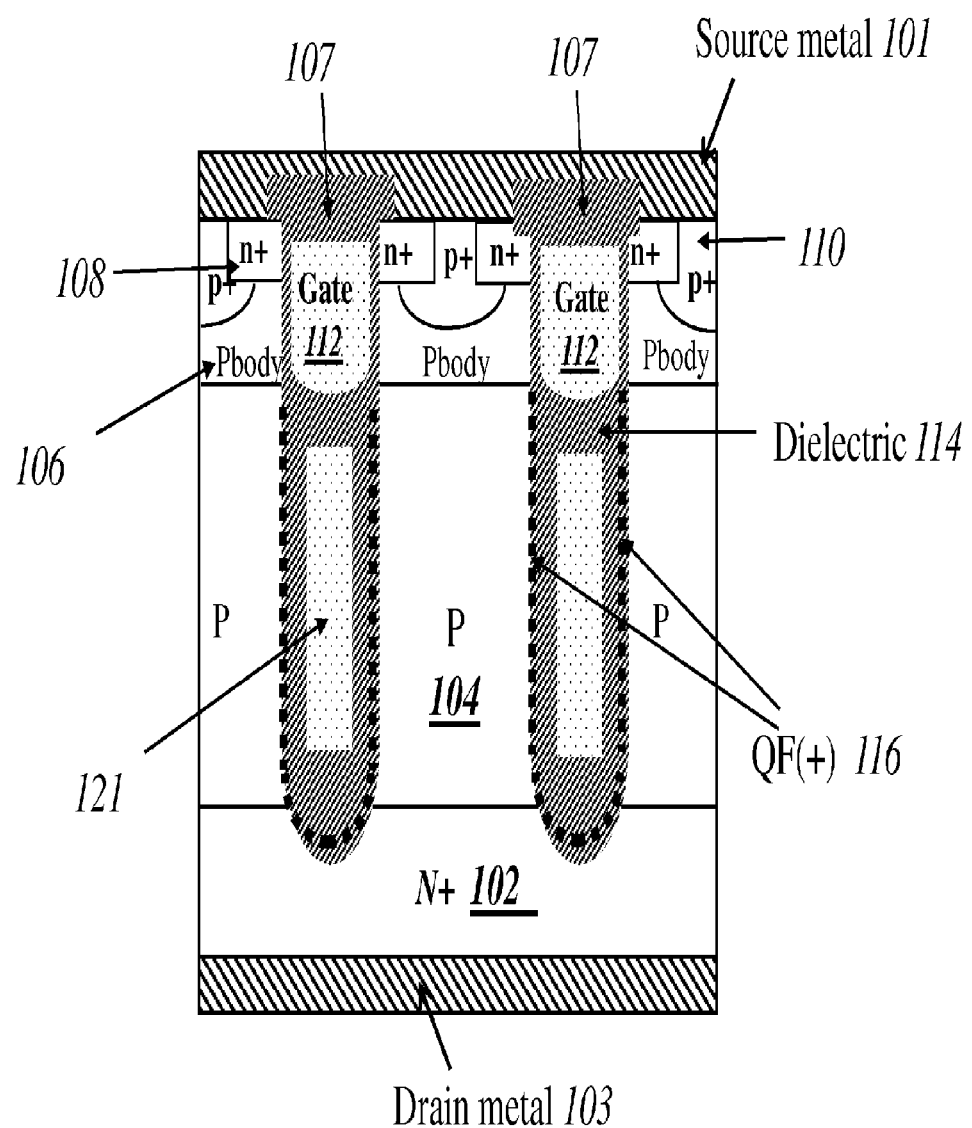
FIG. 1 shows a vertical MOS transistor with trenches filled with gate and buried field plate electrodes and dielectric material containing permanent positive charge ($Q_F$).

FIG. 1 shows a first example of an innovative structure. This example shows a trench MOSFET structure built on p-type epitaxial layer 104, an insulated gate 112 and a buried or embedded field plate 121 inside a trench which is otherwise filled with dielectric 114. The insulated gate 112 and embedded field plate 121 are formed using conducting material such doped polysilicon. The buried field plate electrode 121 preferably contacts the source electrode 101 at least at some places of the device or alternatively is left floating. The gate electrode 112 can invert nearby portions of a p-type body region 106 which is contacted by a p+ body contact diffusion 110, as well as an n+ source region 108. Positive permanent or fixed net electrostatic charge 116 is present near the trench sidewalls, and provides improved charge balancing when the epitaxial layer 104 is depleted under reverse bias. Under these conditions the buried field plate electrode 121 causes the electric field to spread even more uniformly and hence a higher breakdown and/or a lower $R_{SP}$ is achieved. Furthermore, the buried field plate 121 helps to shield the gate electrode to reduce gate-drain capacitance Cgd.

In the ON state the permanent charge forms an induced drift region by forming an inversion layer along the interface between the oxide and the P-type layer 104. An adequate gate bias forms a channel region where excess electrons are present. Under these conditions electrons can flow from source 108, through the channel portion of p-type body region 106 and inversion layer in drift region 104 (which in this example is simply a portion of the p-type epitaxial layer 104), to the drain 102. Source metallization 101 makes ohmic contact to source diffusion 108 and to p+ body contact region 110, and drain metallization 103 makes contact to the drain 102. Thus the source, gate, and body in combination form a current-controlling structure, which (depending on the gate voltage) may or may not allow injection of majority carriers into the drift region. It is noted that the oxide thickness at the channel region is thinner than that at the lower part of the trenches (along the sidewall and bottom) to withstand the higher voltage drop in this region. Furthermore, the dielectric material 114 thicknesses between the gate electrode and buried field plate electrode, along trench sidewalls and trench bottom are all independent design parameters.

One class of embodiments describes devices which include trenches with walls covered by a dielectric material such as silicon dioxide that contains permanent or net electrostatic charges and a buried field plate electrode made of conducting material such doped polysilicon. At reverse bias voltage the positive permanent charge compensates negative charge of the P region depletion charge as well as charge created on the buried polysilicon field plate. The electric field lines emanating from the positive permanent charge terminate on both the P region's depletion region negative charge as well as the buried field plate. This results in higher breakdown voltage for the same $Q_F$, or alternatively higher $Q_F$ values for the same breakdown voltage, as compared to the MOSFET structure shown in FIG. 2.

FIGS. 3A, 3B, and 3C show simulation results for the two-dimensional potential contours at the onset of avalanche breakdown. The structures used in the simulations include versions with and without a buried field plate electrode, but otherwise all other parameters are identical. The cell pitch is 3 µm with trench width of about 1.5 µm and mesa width of about 1.5 µm. It should be noted that only a half cell is used for simulations.

In the previously proposed structure shown in FIG. 2, the positive charge $Q_F$ provides improved balancing of the negative depletion charge of the P drift region 204. The same effect occurs in the new structure of FIG. 1, but (in addition) the electric field lines emanating from the positive permanent charge 116 terminate on both the buried field plate 121 and negative charge of the P region 104. This results in a lower maximum electric field, and hence a higher breakdown voltage.

Comparison of FIGS. 3B and 3C shows this in more detail. In FIG. 3B it can be seen that (with a permanent positive charge of e.g. $Q_F$=2.2e12 cm$^{-2}$, in a structure like that of FIG. 1) with the source and buried field plate grounded the breakdown voltage is increased from 40 volts (as in FIG. 3A) to 107 volts, due to the synergistically combined effects of the buried field plate and the electrostatic charge. Correspondingly, it can be seen that a higher voltage drop appears across the dielectric (e.g. silicon dioxide) at the trench sidewalls and bottom, i.e. between the buried field plate and silicon. This implies that the thickness of this dielectric must be large enough to withstand the additional voltage drop which results from this different isopotential map.

In this example, the p-type epi doping was taken to be 1.3e16 cm$^{-3}$, but of course other target values can be used. There will also be some normal process variation.

FIG. 3C shows simulation results for a structure with the same dimensions as that simulated in FIG. 3B, but with an important difference: in FIG. 3C the density of the immobile electrostatic charge has been set to $Q_F=1e10$ cm$^{-2}$, which would be in the range of unintentional background charge. (This value is dependent on the particular process sequence, but any interface to crystalline semiconductor material is likely to have some amount of charge per unit area.)

In FIGS. 3B and 3C, the lines drawn onto the structural elements are isopotential contours. In each case, the applied voltage has been divided into equal increments, to show these contours. Since the applied voltages in these two figures are different, the increment between neighboring isopotential contours is different, but the pattern of the isopotential contours is informative. The field plate itself, being a conductor, is all at a single voltage, so no lines of isopotential actually intersect the surface of the field plate. However, many lines of isopotential can be followed through the semiconductor material and the dielectric material.

Figure 3D:
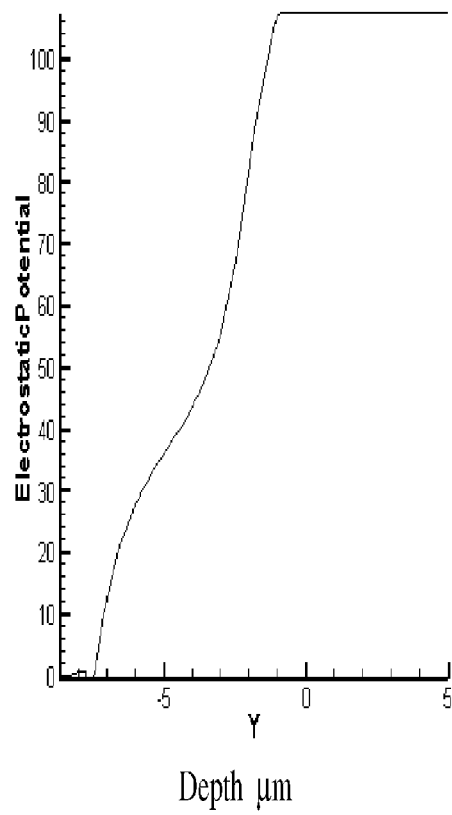
Figure 3F:
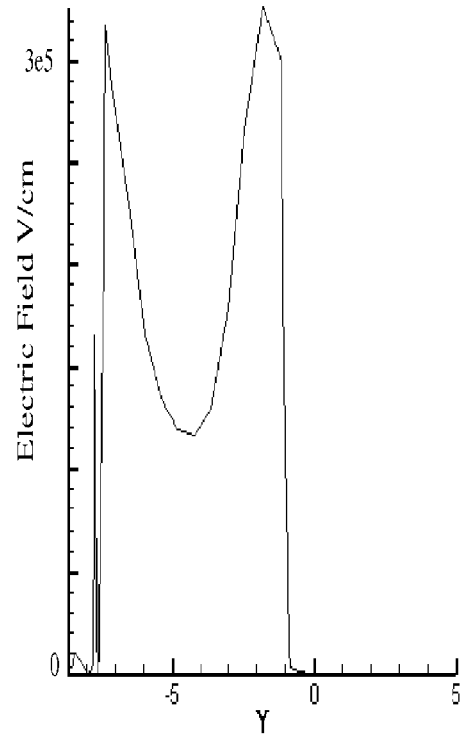
Figure 3E:
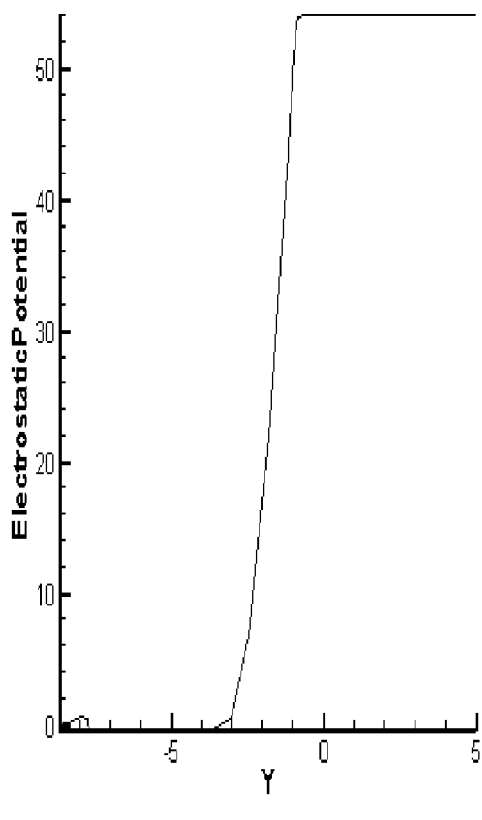

By comparing these contours in FIGS. 3B and 3C, it can be seen that the potential contours are much more evenly spaced in the semiconductor material, in the structure of FIG. 3B. This can be better understood by looking at a plot of voltage versus depth: FIG. 3D shows voltage (potential) as a function of depth for the structure simulated in FIG. 3B, and FIG. 3E shows potential as a function of depth for the structure simulated in FIG. 3C. The flat portion at the right of each of these curves shows the drain voltage, which is different for the two simulations. Note that the curve in FIG. 3D has more of a steady rise, whereas the curve in FIG. 3E is flatter at the left side, and has a sharper rise near the flat portion at the right.

Figure 3G:
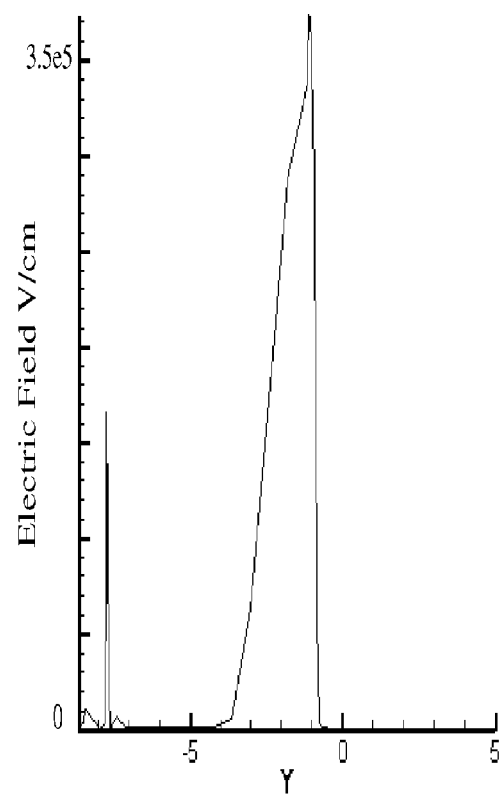

The next pair of Figures is based on the same pair of simulations: FIG. 3F shows the magnitude of the electric field as a function of depth for the structure simulated in FIG. 3B, and FIG. 3G shows the magnitude of the electric field as a function of depth for the structure simulated in FIG. 3C. In each case breakdown will occur when the electric field reaches the critical value of about 3.3E5 V/cm anywhere in the conduction path. In FIG. 3F it happens that this occurs near both the surface and the N+ P drift junction of the device, but a more important difference is that the electric field away from the location of breakdown averages out to be a much higher fraction of the critical electric field in FIG. 3F than in FIG. 3G. Since these two examples have the same dimensions and (in most respects) parameters, the higher average field, away from the location of breakdown, means that a higher total voltage drop can be accommodated in the case of FIG. 3B than in the case of FIG. 3C. (In practice, breakdown of the junction between N+ substrate 102 and p-type epitaxial layer 104 might limit the breakdown of the structure simulated in FIG. 3C to even less than 53 Volts.)

This is a somewhat qualitative observation. As one way to quantify it, we can note that in the example of FIG. 3B, the local maximum of the electric field occurs at scaled depth −7.2, and the third of the drift region closest to the depth of that maximum (i.e. between scaled units −7.2 and −5.5 on the y-axis) contains only about 37% of the total voltage drop. By contrast, in the example of FIG. 3C, the local maximum of the electric field occurs at scaled depth −1.0, and the third of the drift region closest to the depth of that maximum (i.e. between scaled units −1.0 and −3 on the y-axis) contains almost 100% of the total voltage drop (i.e. 53V between scaled depths −7.2 and −1.0). Stated differently, the two-thirds of the drift region thickness which are not adjacent to the location of breakdown carry more than 60% of the total voltage drop in FIG. 3B, but none of the total voltage drop in the example of FIG. 3C.

Another way to characterize the differences which result from the combination of a field plate with an optimal level of fixed electrostatic charge, in the example of FIG. 1, is to note how much voltage drop occurs in the top one-third of the drift layer. In the simulation of FIG. 3B, about 35V is dropped across this thickness, whereas in the example of FIG. 3C almost no voltage is dropped across this thickness. That is, the presence of the field plate creates a local maximum near the bottom corner of the field plate, but the presence of fixed electrostatic charge increases the electric field in the top third of the drift region, and hence permits a larger total voltage to be withstood before breakdown.

Another way to describe the important differences between the cases simulated in FIGS. 3B and 3C is to note that the electric field profiles of FIGS. 3F and 3G both have two local maxima, but the ratios of maximum to minimum are very different. In FIG. 3F the lesser of the two maxima is about 95% of the critical field, whereas in FIG. 3G the lesser maximum is only about 40% of the critical voltage. Thus another of the teachings of the present application is that is desirable to have an electric field profile which, at breakdown, has a secondary local maximum of at least 50% of the overall maximum field in the drift region (i.e. the critical breakdown field). It is even more preferable to have the secondary local maximum be at least 70% of the maximum field, and more preferable yet to have the secondary local maximum in the range of 85% to 100% of the maximum.

Figure 4A:
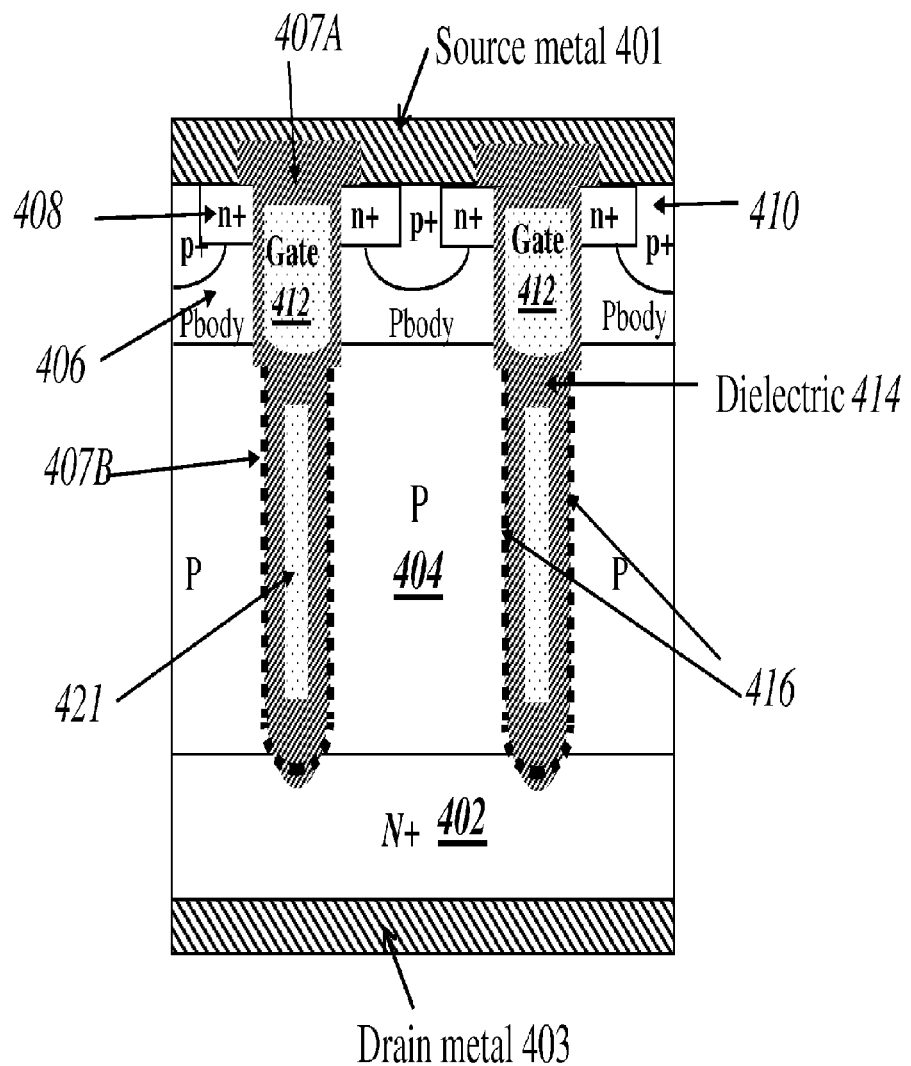
FIGS. 4A-4D show several examples of vertical MOS transistors with trenches filled with buried field plate electrode and dielectric material containing permanent positive charge ($Q_F$), according to various disclosed innovative embodiments.

FIG. 4A shows another example of a trench MOSFET structure. This example is generally somewhat similar to that shown in FIG. 1, except that the trench top portion width 407A is wider than the bottom portion 407B. The wider top of the trench results in an easier process to fill the trench with dielectric material.

Figure 4B:
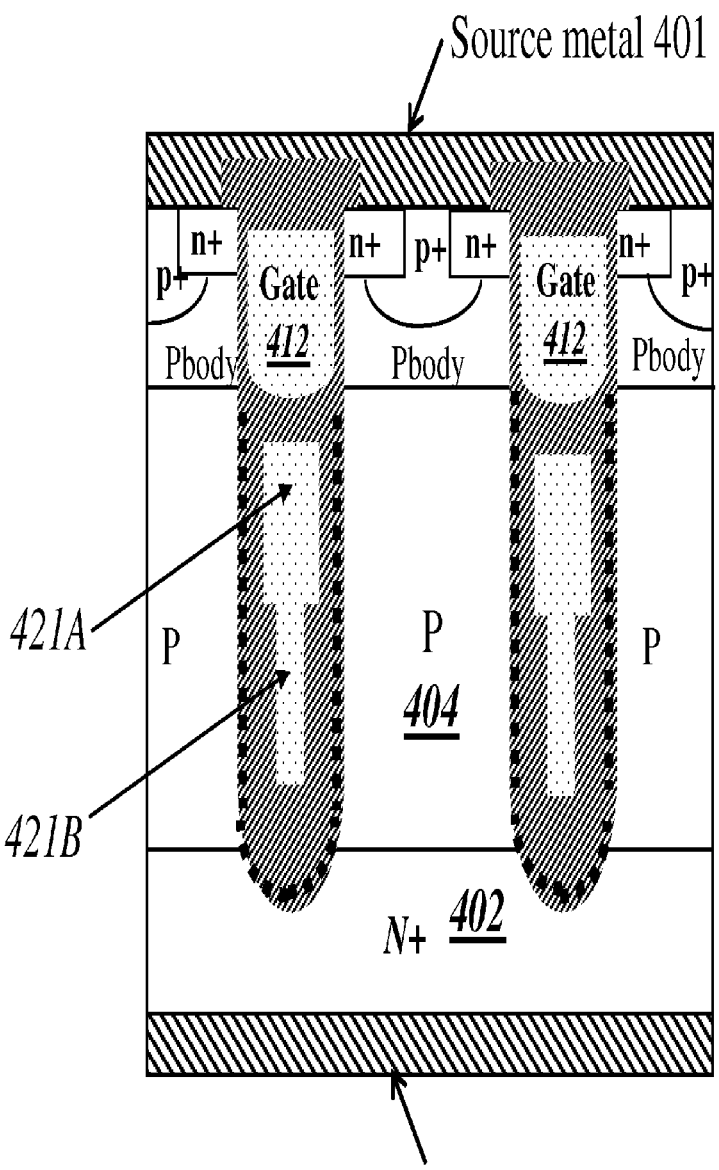

FIG. 4B shows another example of a trench MOSFET structure which is generally somewhat similar to that shown in FIG. 1, except that the trench sidewall oxide is stepped. This results in a wider buried field plate width in the top portion of the trench 421A than the lower portion 421B. This results in a gradation of the field plate field shaping effect, i.e. more uniform electric field distribution or higher breakdown voltage.

Figure 4C:
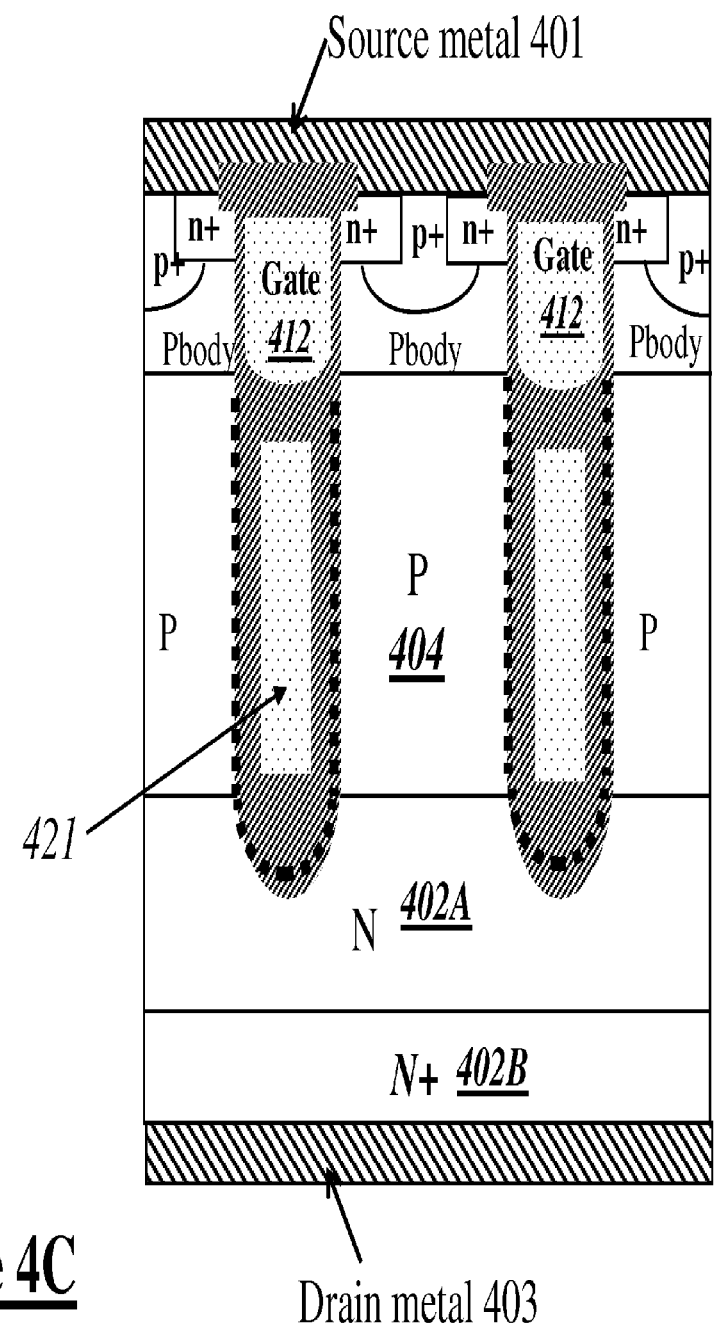

FIG. 4C shows another example of a trench MOSFET structure which is generally somewhat similar to that shown in FIG. 1, except that a lightly doped N drift layer 402A is formed on top of the heavily doped N+ substrate 402B. This increases the breakdown voltage of the substrate diode.

Figure 4D:
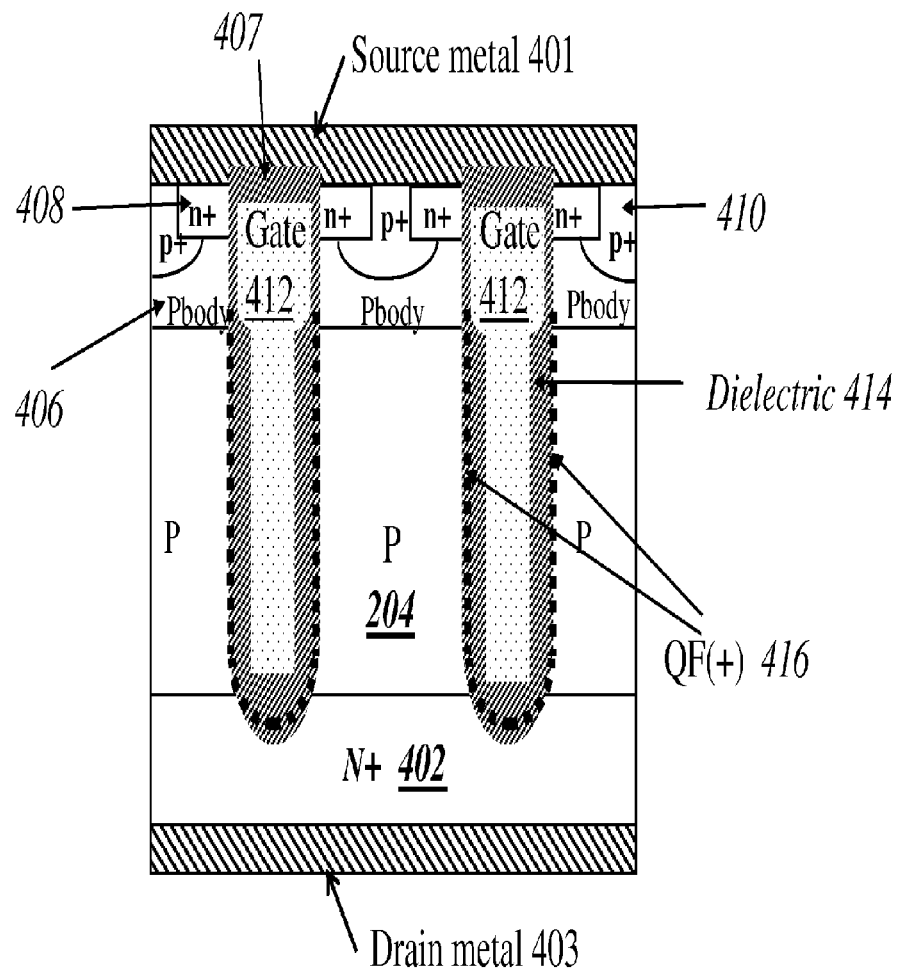

FIG. 4D shows yet another example of a trench MOSFET structure which is generally somewhat similar to that shown in FIG. 1, except that gate electrode 412 extends to the bottom of the trench. In the ON state the gate bias enhances the inversion charge in the drift region and results in lower $R_{SP}$. However, the gate drain capacitance Cgd is increased.

Figure 5A:
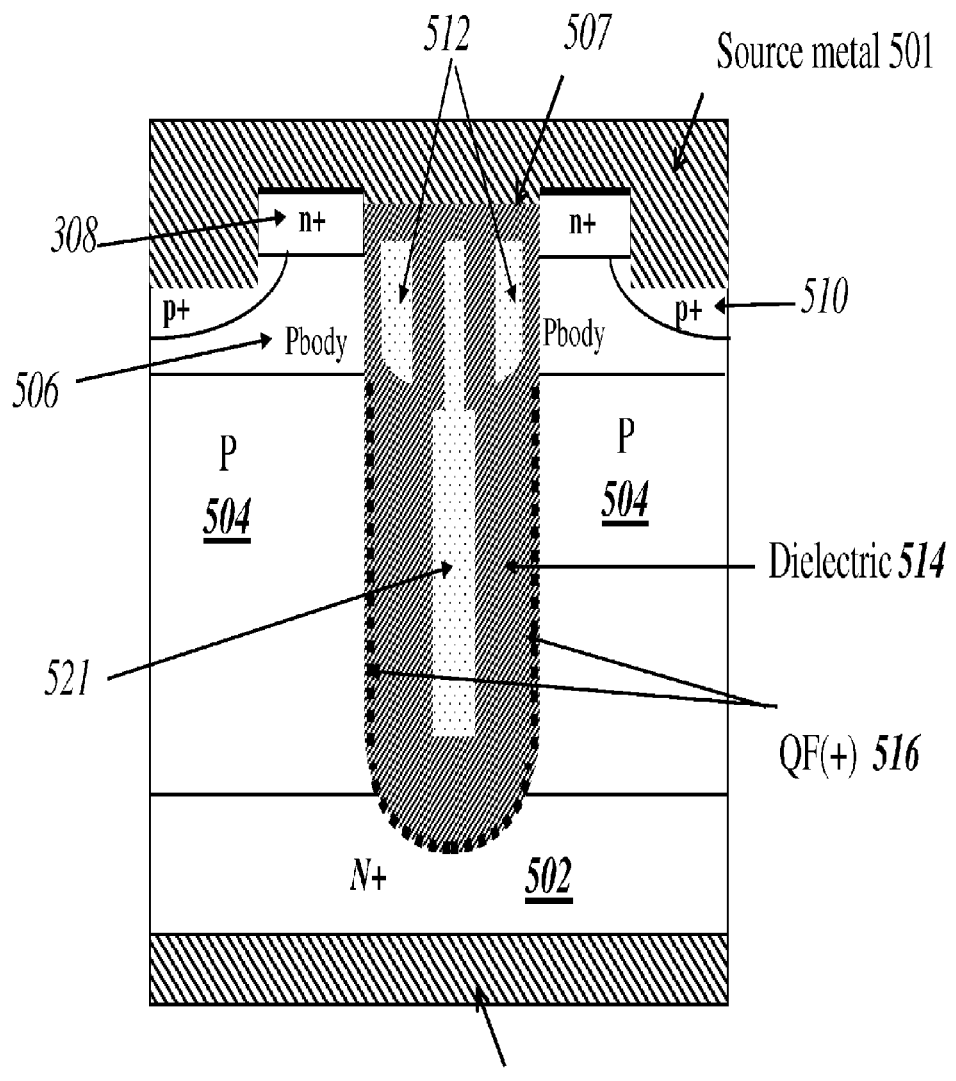
FIGS. 5A-5C show several examples of vertical MOS transistors with trenches filled with buried field plate electrode that extends towards the surface and dielectric material containing permanent positive charge ($Q_F$), according to various disclosed innovative embodiments.

FIG. 5A shows one example of a trench MOSFET structure which is generally somewhat similar to that shown in FIG. 1, except that the buried field plate electrode 521 extends upwards and is surrounded by the insulated gate electrode 512. This provides a simpler processing than the device shown in FIG. 1 particularly for higher voltage devices where wider trench widths can be used.

Figure 5B:
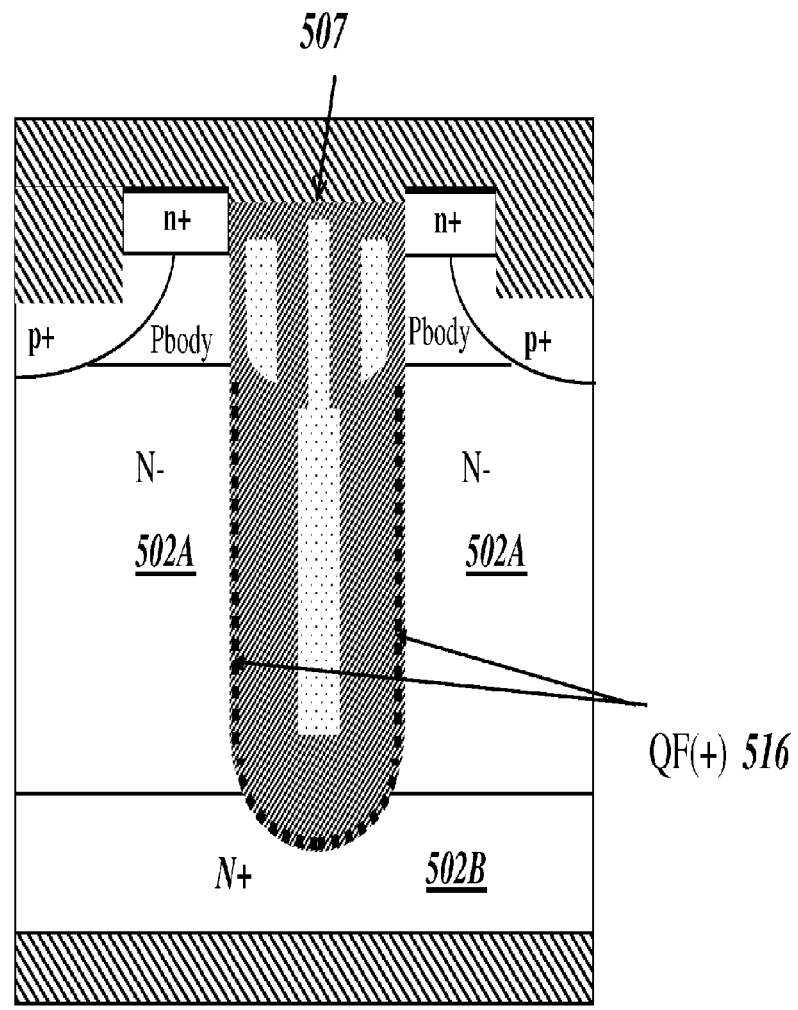

FIG. 5B shows another example of a trench MOSFET structure which is generally somewhat similar to that shown in FIG. 5A, except that the p-type drift layer 504 is replaced by a lightly doped N− drift layer 502A that is formed on top of the heavily doped N+ substrate 502B. It should be noted that in the ON state the positive permanent charge 516 creates an induced accumulation layer in the N− drift region 502A that enhances current conduction and results in a lower Rsp. The doping of the N− drift layer 502A is chosen to support the desired breakdown voltage. Furthermore using an N− drift layer a conventional termination structure can be used.

Figure 5C:
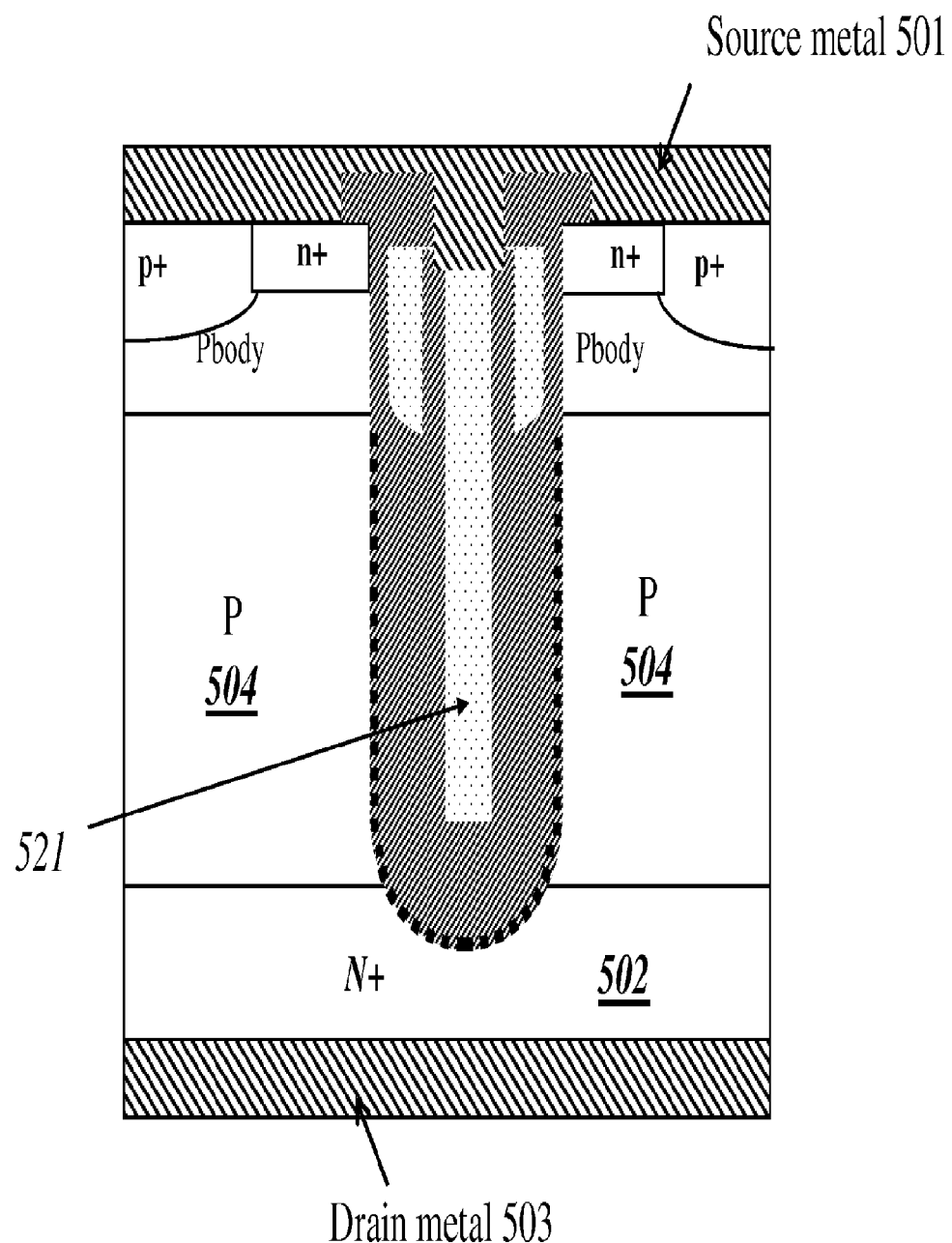

FIG. 5C shows another example of a trench MOSFET structure which is generally somewhat similar to that shown in FIG. 5A, except that the buried field plate electrode is contacted at the surface to the source metal 501.

Figure 6A:
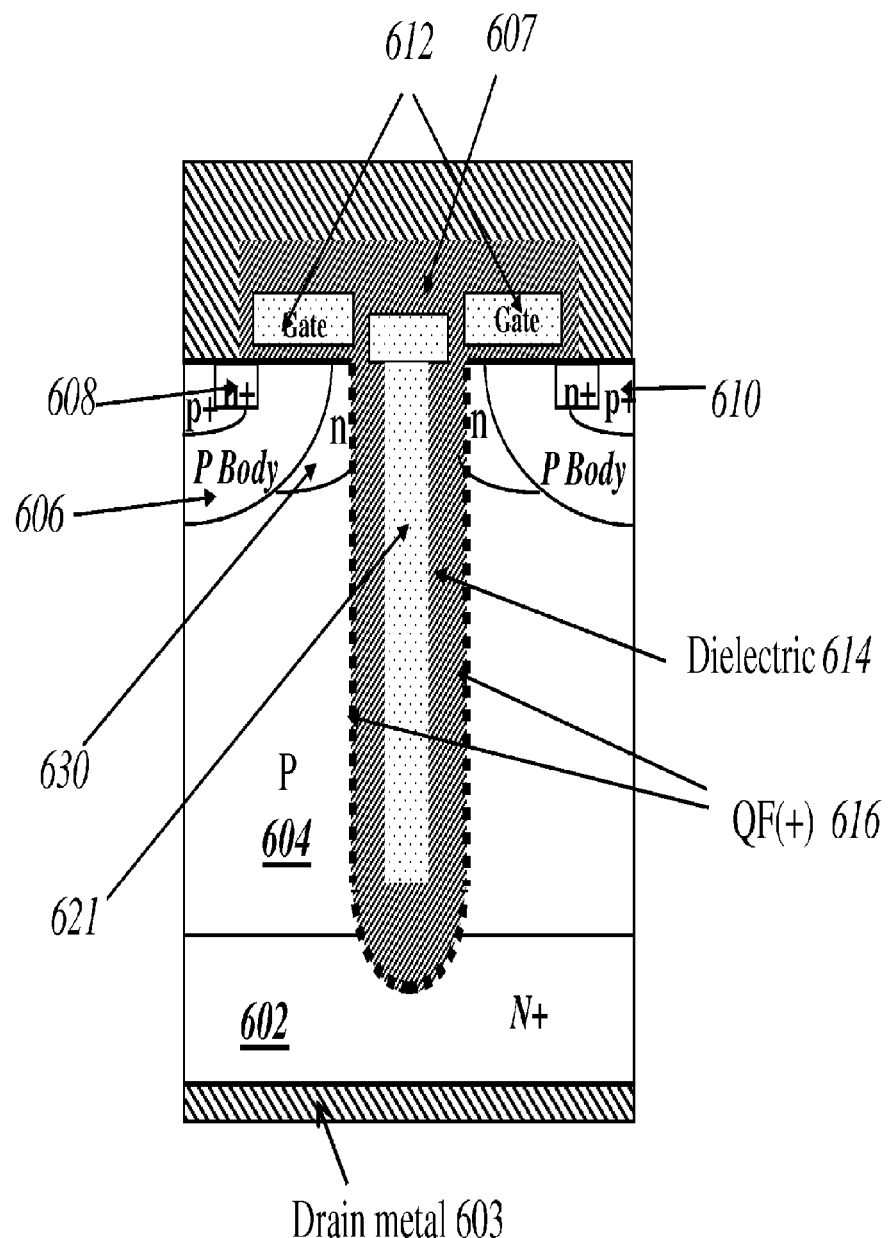
FIGS. 6A-6F show several examples of vertical trench MOS transistors with planar gate electrode, buried field plate electrode and dielectric material containing permanent positive charge ($Q_F$), according to various disclosed innovative embodiments.

In another class of examples the insulated gate is located on top of the silicon surface rather than inside a trench. FIG. 6A shows one example of a trench MOSFET structure built on p-type epitaxial layer and an insulated planar gate 612 and a buried or embedded field plate 621 formed inside the trench which is otherwise filled with dielectric 614. The insulated planar gate 612 and embedded field plate are formed using conducting material such doped polysilicon. The buried field plate electrode 621 preferably contacts the source electrode 601 at least at some places of the device, or alternatively is left floating. The gate electrode 612 can invert nearby portions of a p-type body region 606 which is contacted by a p+ body contact diffusion 610, and which also abuts an n+ source region 608. Positive permanent or fixed net electrostatic charge 616 is present near the trench sidewalls, and provides improved charge balancing when the epitaxial layer 604 is depleted under reverse bias. Under these conditions the buried field plate electrode 621 causes the electric field to spread even more uniformly and hence a higher breakdown and/or a lower $R_{SP}$ is achieved. Furthermore, the buried field plate 621 helps to shield the gate electrode to reduce gate-drain capacitance Cgd.

In the ON state the permanent charge forms an induced drift region by forming an inversion layer along the interface between the oxide and the P-type layer 604. An adequate gate bias forms a channel region where excess electrons are present. Under these conditions electrons can flow laterally from source 608, through the channel portion of p-type body region 606 to an optional surface n layer 630. Electrons then flow vertically through the inversion drift region 604 (which in this example is simply a portion of the p-type epitaxial layer 604), to the drain 602. Source metallization 601 makes ohmic contact to source diffusion 608 and to p+ body contact region 610, and drain metallization 603 makes contact to the drain 602. Thus the source, gate, and body in combination form a current-controlling structure, which (depending on the gate voltage) may or may not allow injection of majority carriers into the drift region. It is noted that the oxide thickness along the sidewalls and bottom should be adequate to withstand the required voltage drop.

Figure 6B:
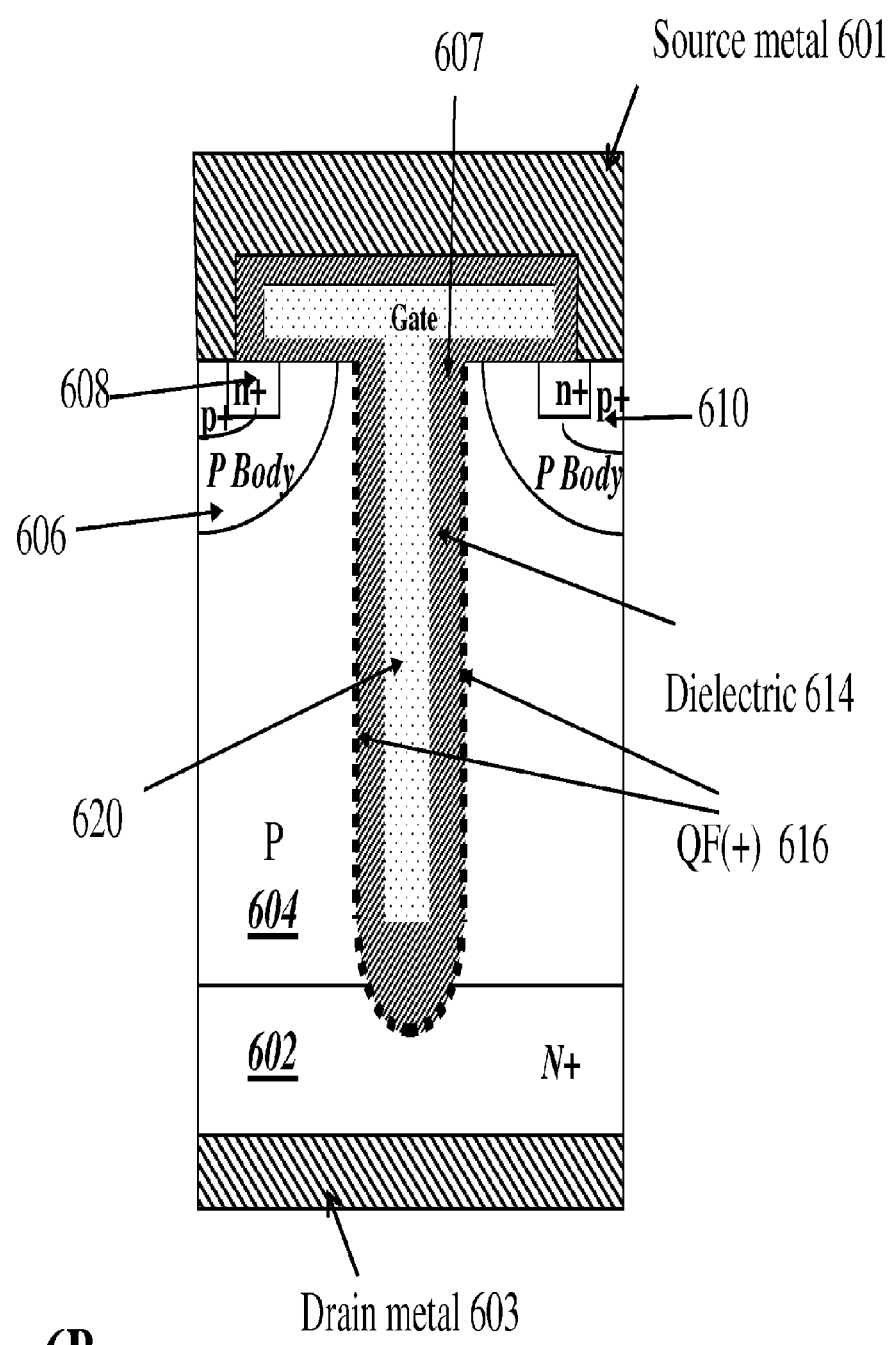

FIG. 6B shows another example of a trench MOSFET structure which is generally somewhat similar to that shown in FIG. 6A, except that the buried field plate electrode is contacted to the planar gate forming one electrode 620.

Figure 6C:
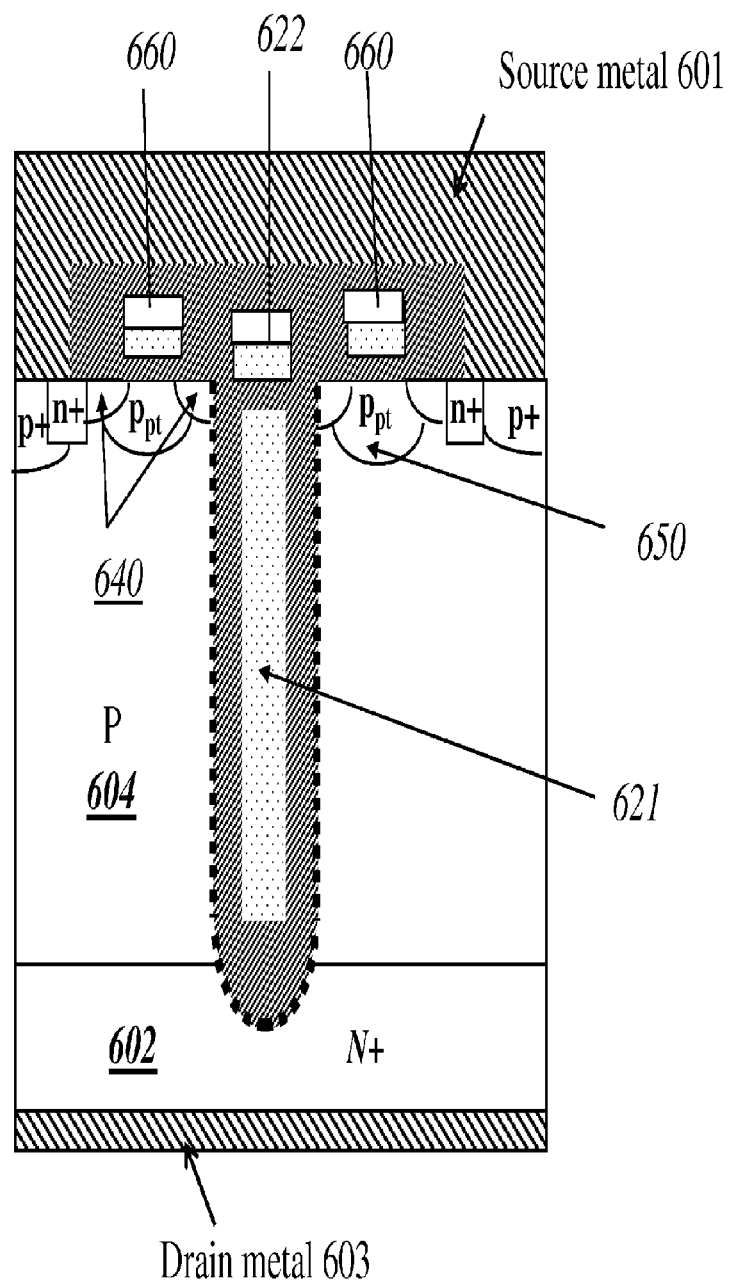

FIG. 6C shows another example of a MOSFET structure which is generally somewhat similar to that shown in FIG. 6A, except that it has a self-aligned lightly doped n source and drain regions 640 and an optional anti-punch through and threshold adjustment p-type region 650. Furthermore, a surface electrode 622 is used to shield the gate electrode 660 to lower gate-drain capacitance Cgd. The gate electrode and shield electrodes 640 and 622 can be optionally silicided to lower their sheet resistance.

Figure 6D:
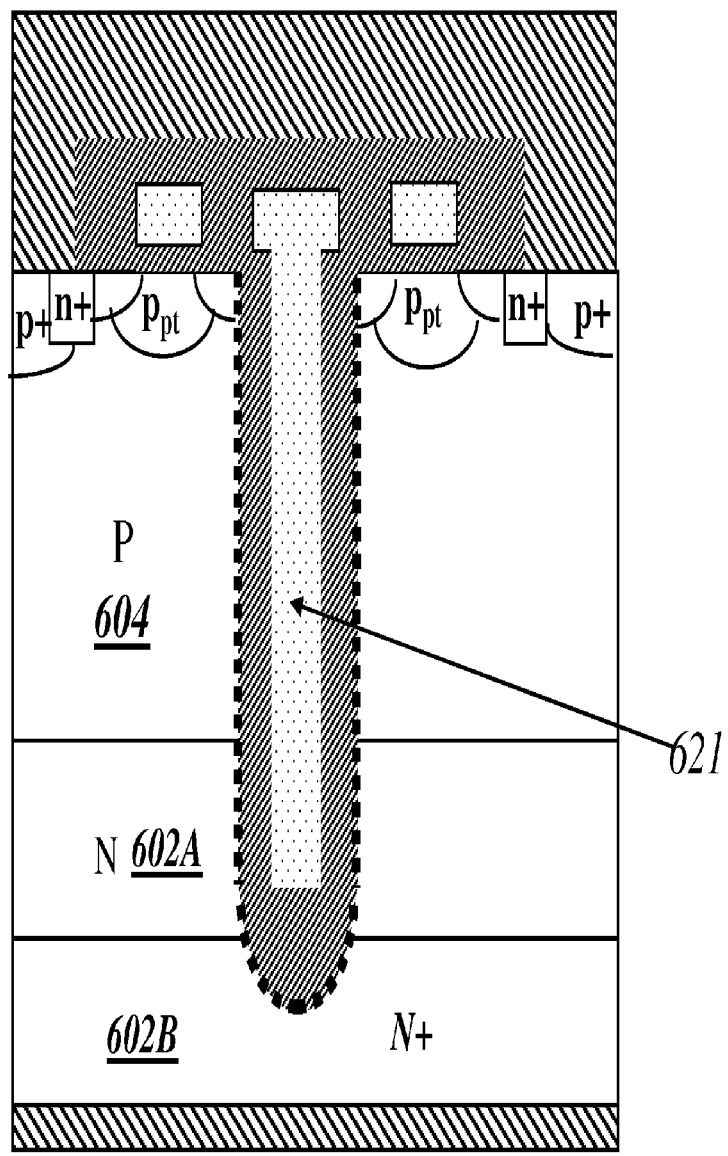

FIG. 6D shows another example of a MOSFET structure which is generally somewhat similar to that shown in FIG. 6A, except that a lightly doped N drift layer 602A is formed on top of the heavily doped N+ substrate 602B.

Figure 6E:
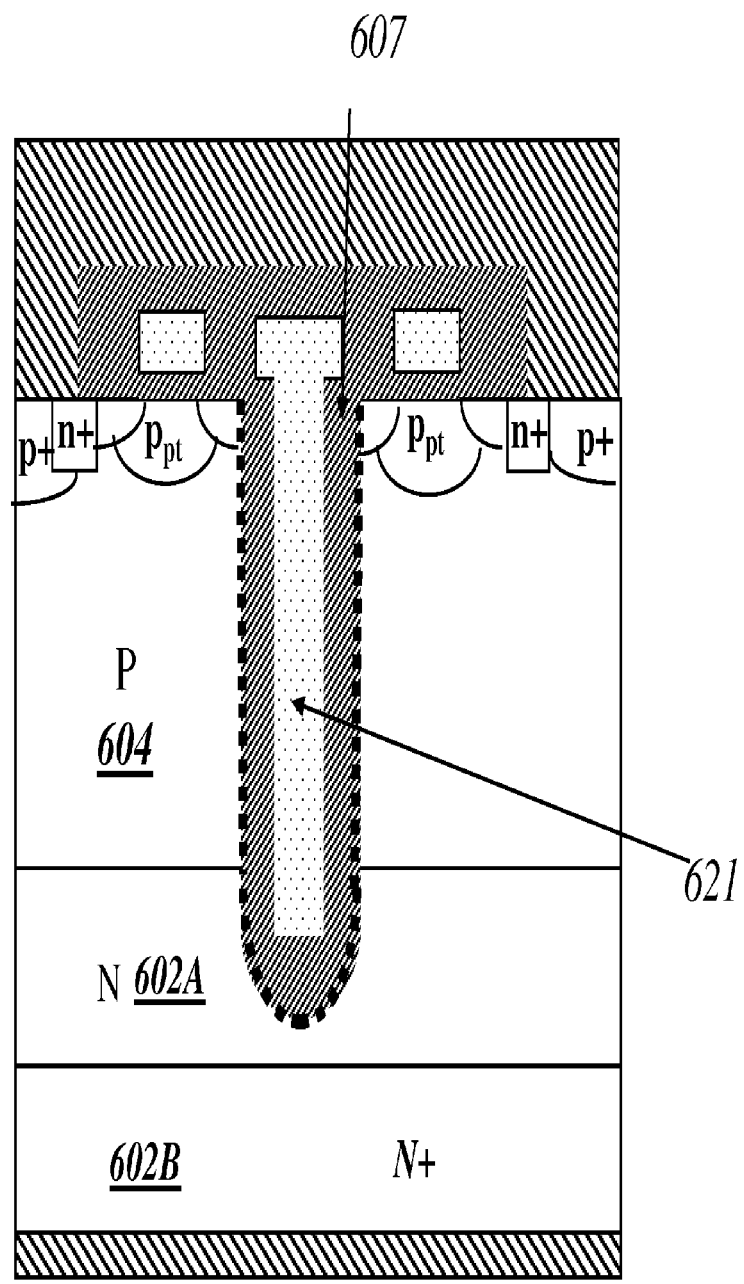

FIG. 6E shows another example of a MOSFET structure which is generally somewhat similar to that shown in FIG. 6D, except that the trench 607 extends only to a lightly doped N drift layer 602A.

Figure 6F:
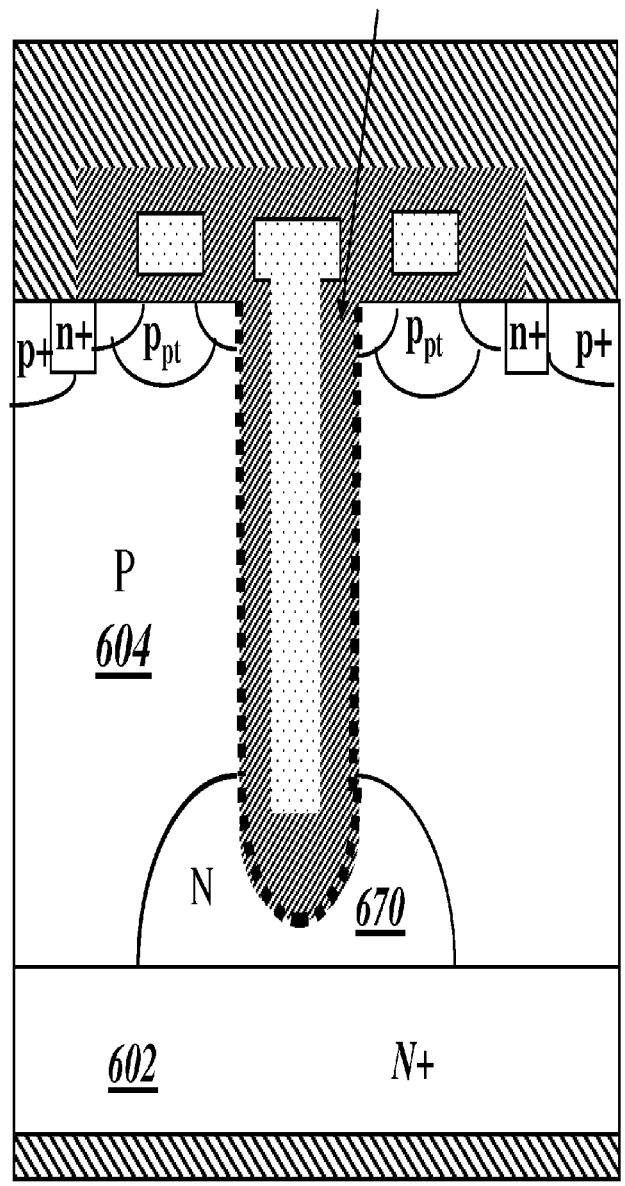

FIG. 6F shows another example of a MOSFET structure which is generally somewhat similar to that shown in FIG. 6E, except that the lightly doped N layer 602A is replaced a local lightly doped N drift layer 670. The N drift layer 670 can be formed for example by implanting phosphorus or other donor type doping through the bottom of the trench.

Figure 7A:
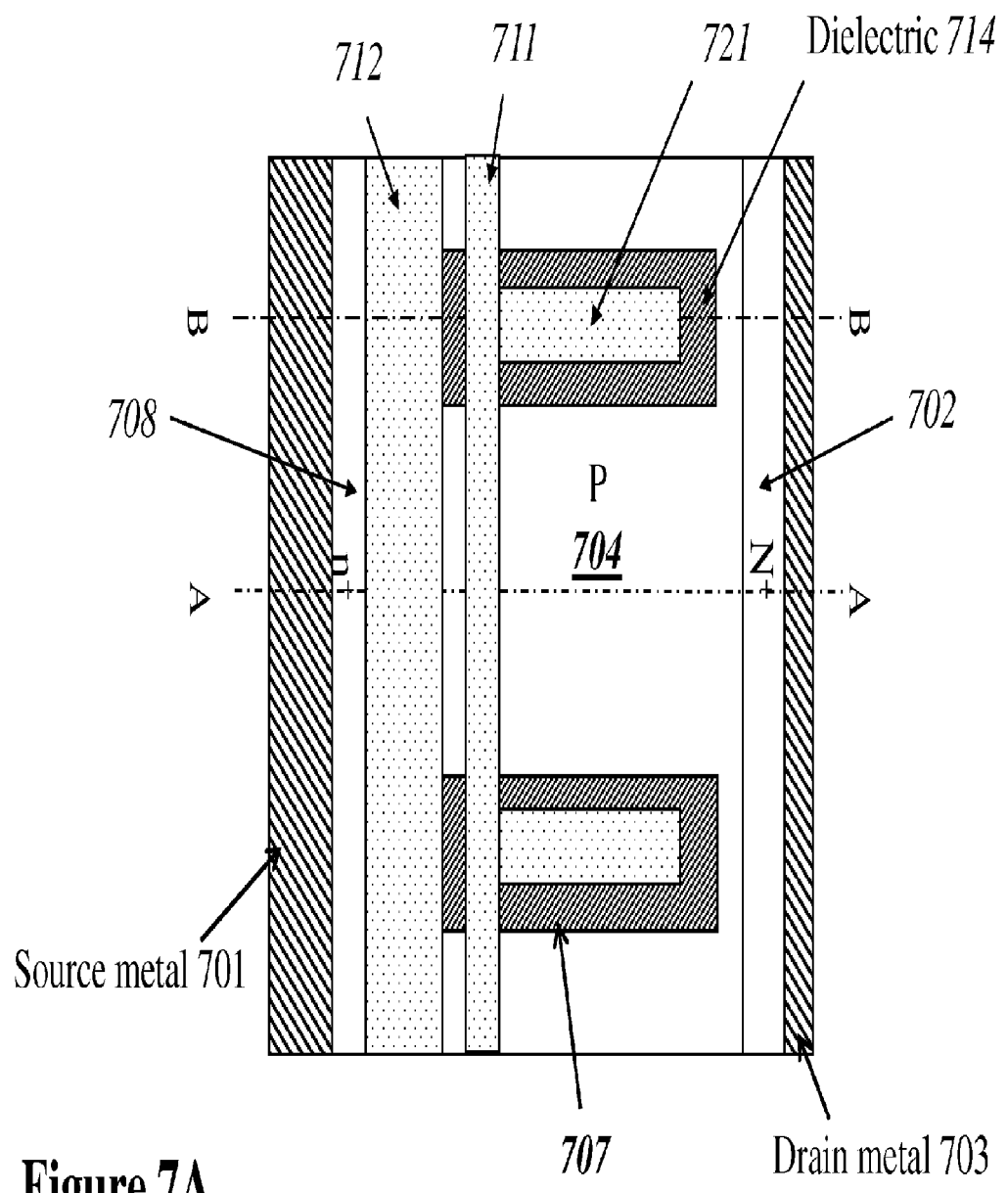
FIGS. 7A-7G show several examples of lateral trench MOS transistors with planar gate electrode, buried field plate electrode and dielectric material containing permanent positive charge ($Q_F$), according to various disclosed innovative embodiments.
Figure 7B:
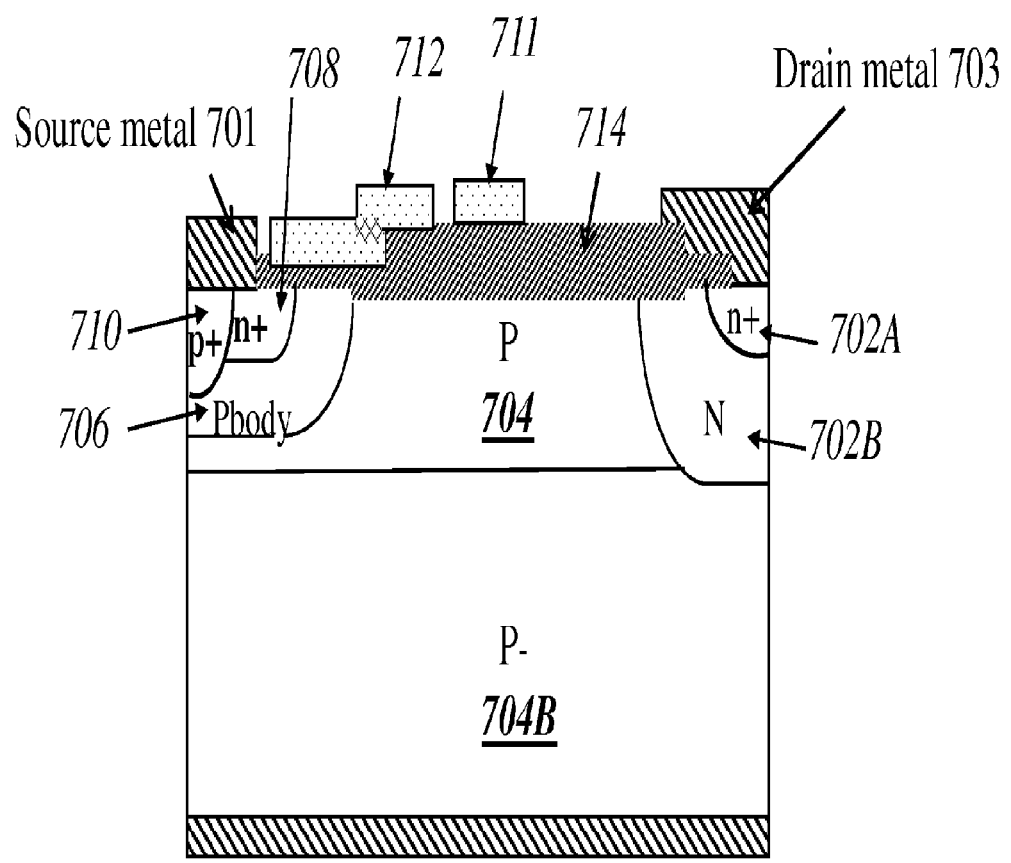
Figure 7C:
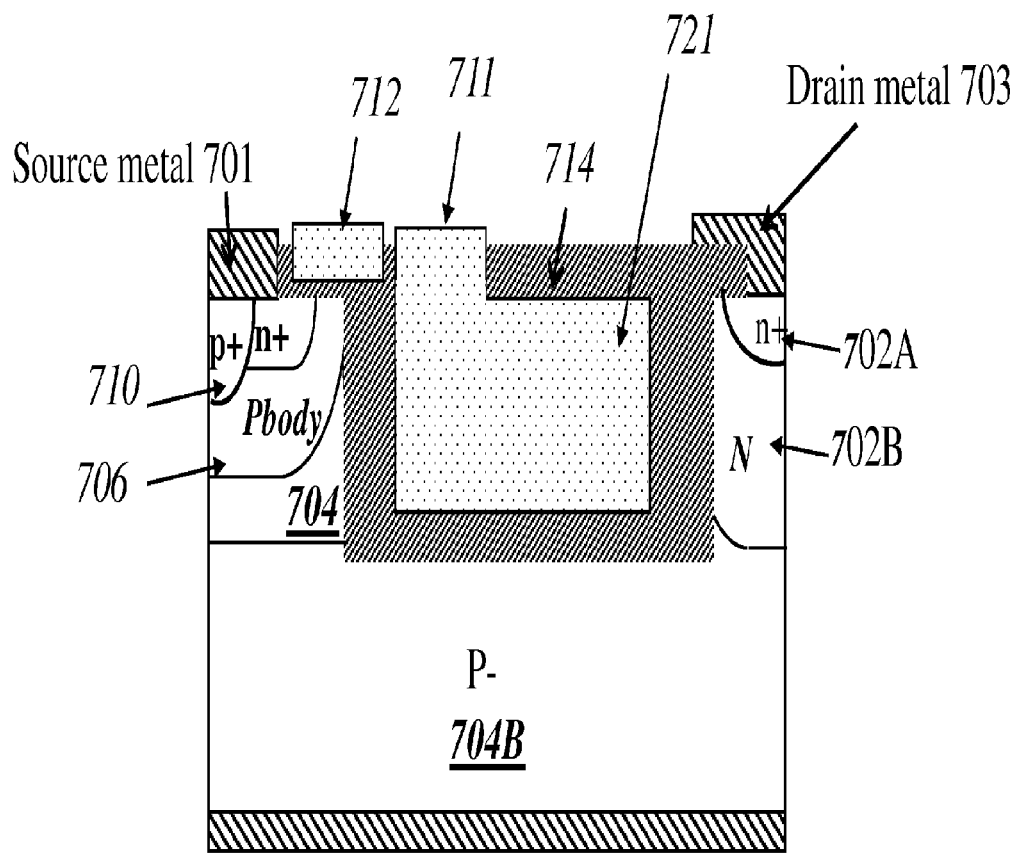

In another class of examples the MOSFET is a lateral device where the source, gate and drain electrodes are accessible from the device surface. FIG. 7A shows a top view of an example of a Lateral MOSFET structure, and FIGS. 7B and 7C show cross-sectional views of the same device, taken along line AA' and BB' as shown in FIG. 7A. In this example, the n-channel lateral semiconductor device includes an n+ source 708, a p-type body region 706 which separates the source 708 from a drift region 704, an n-type deep drain 702B, and an n+ shallow drain diffusion 702A. The drift region 704 is relatively lightly doped, and in this example is p-type. Source metal 701 makes contact to the body 706 (through p+ body contact diffusion 710) and source regions, while drain metal 703 makes ohmic contact to the drain. The device includes lateral trenches 707 filled with dielectric material 714 and a buried field plate 721. The buried field plate 721 is preferably connected to the source metal 701 at least in some places of the device (not shown). Positive permanent or fixed net electrostatic charge is present near the trench sidewalls, and provides improved charge balancing when the P layer 704 is depleted under reverse bias. Under these conditions the buried field plate electrode 721 causes the electric field to spread even more uniformly and hence a higher breakdown and/or a lower $R_{SP}$ is achieved. Furthermore, the field plate 711 helps to shield the gate electrode to reduce gate-drain capacitance Cgd and is preferably connected to the buried field plate 721 as shown in FIG. 7C.

In the ON state the permanent charge forms an induced drift region by forming an inversion layer along the interface between the oxide and the P-type layer 704. It is noted that the oxide thickness at the channel region is thinner than that at surrounding the trench 707 to withstand the higher voltage drop in this region. Conductive gate electrode 712 is capacitively coupled to a surface portion of the body 706, to invert it (and thereby allow conduction) when the voltage on 712 is sufficiently positive. (This portion of the body is therefore referred to as a "channel," but is not separately indicated in this figure.) The electron current flows from the channel through the induced inversion layer in the drift region 704 to the drain.

Figure 7D:
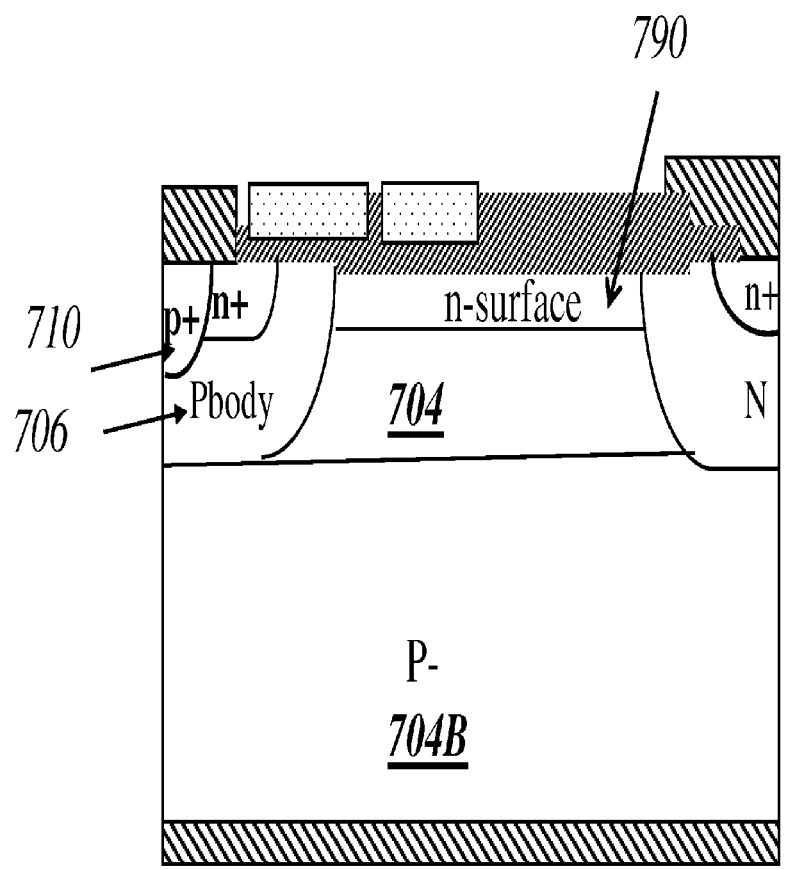

FIG. 7D shows another example of a MOSFET structure which is generally somewhat similar to that shown in FIG. 7B, except that an additional n-surface layer 790 is added to provide an additional current path to lower $R_{SP}$.

Figure 7E:
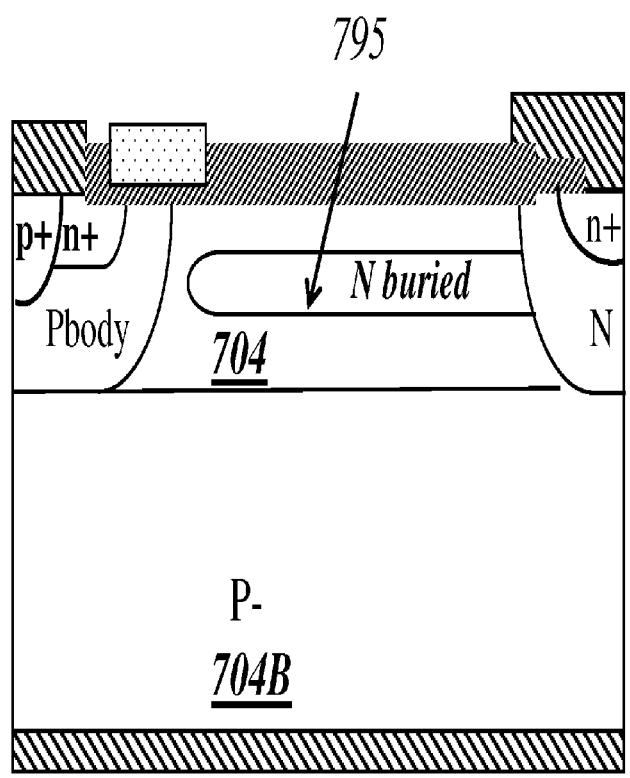

FIG. 7E shows another example of a MOSFET structure which is generally somewhat similar to that shown in FIG. 7B, except that an additional n buried layer 795 provides an additional current path and lowers $R_{SP}$.

Figure 7F:
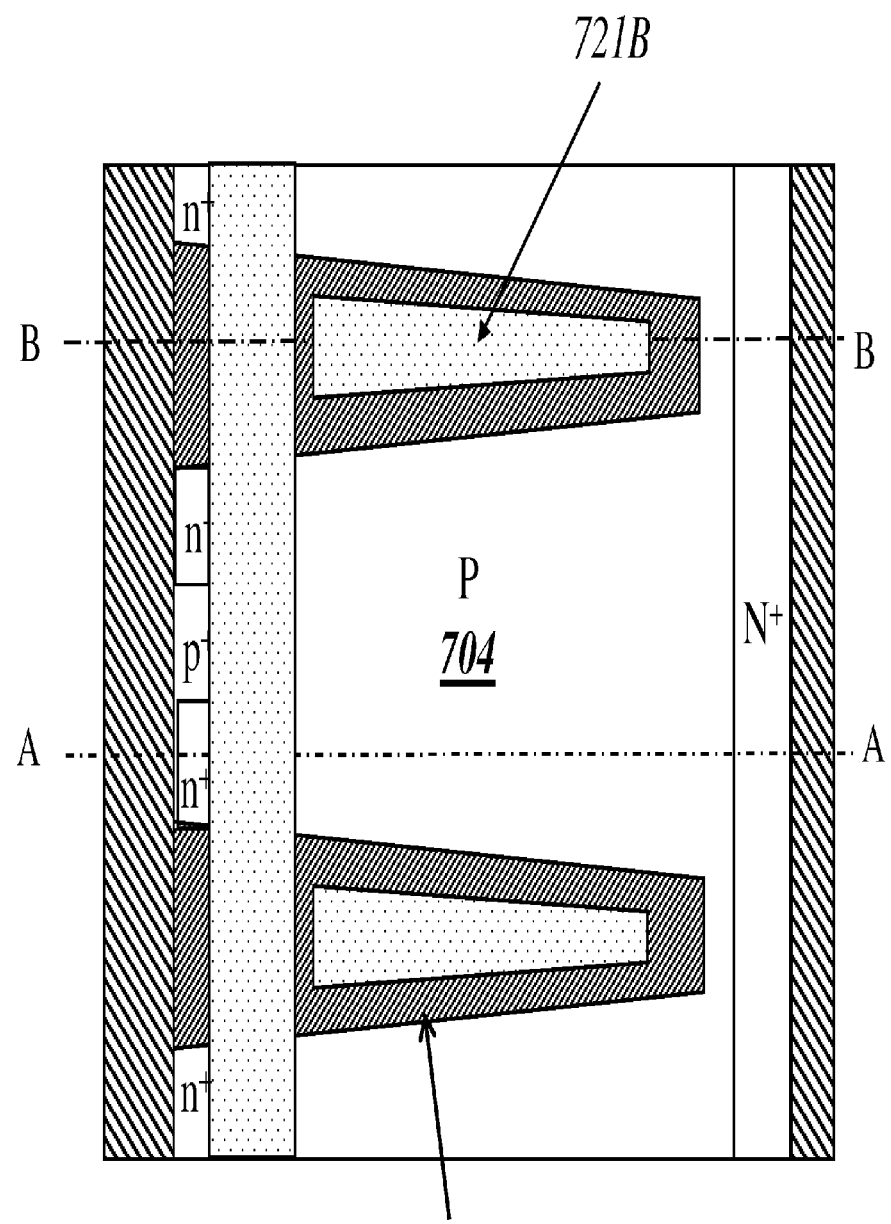

FIG. 7F shows another example of a MOSFET structure which is generally somewhat similar to that shown in FIG. 7A, except that trenches 707 and buried field plate electrodes 721 are tapered from source to drain.

Figure 7G:
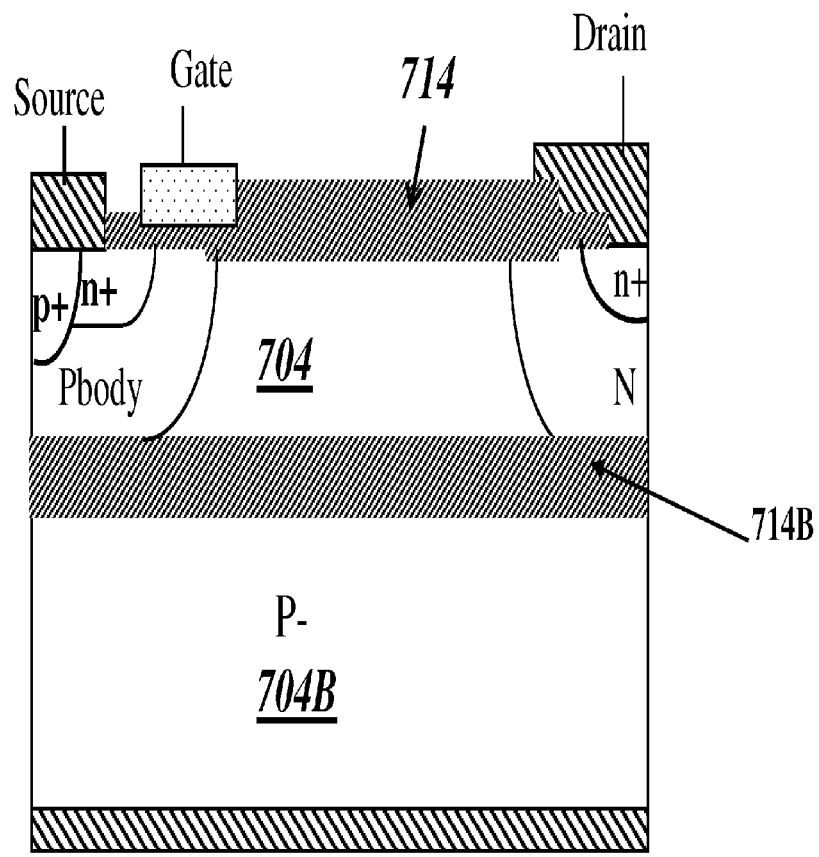

FIG. 7G shows yet another example of a MOSFET which is generally somewhat similar to that shown in FIG. 7B, except that this example is built on dielectric material 714B.

In another class of examples n-type and p-type columns are used to improve the electric field uniformity at reverse bias conditions and the spreading of current spread in the ON state. These improvements results in higher breakdown voltages and lower $R_{SP}$.

Figure 8A:
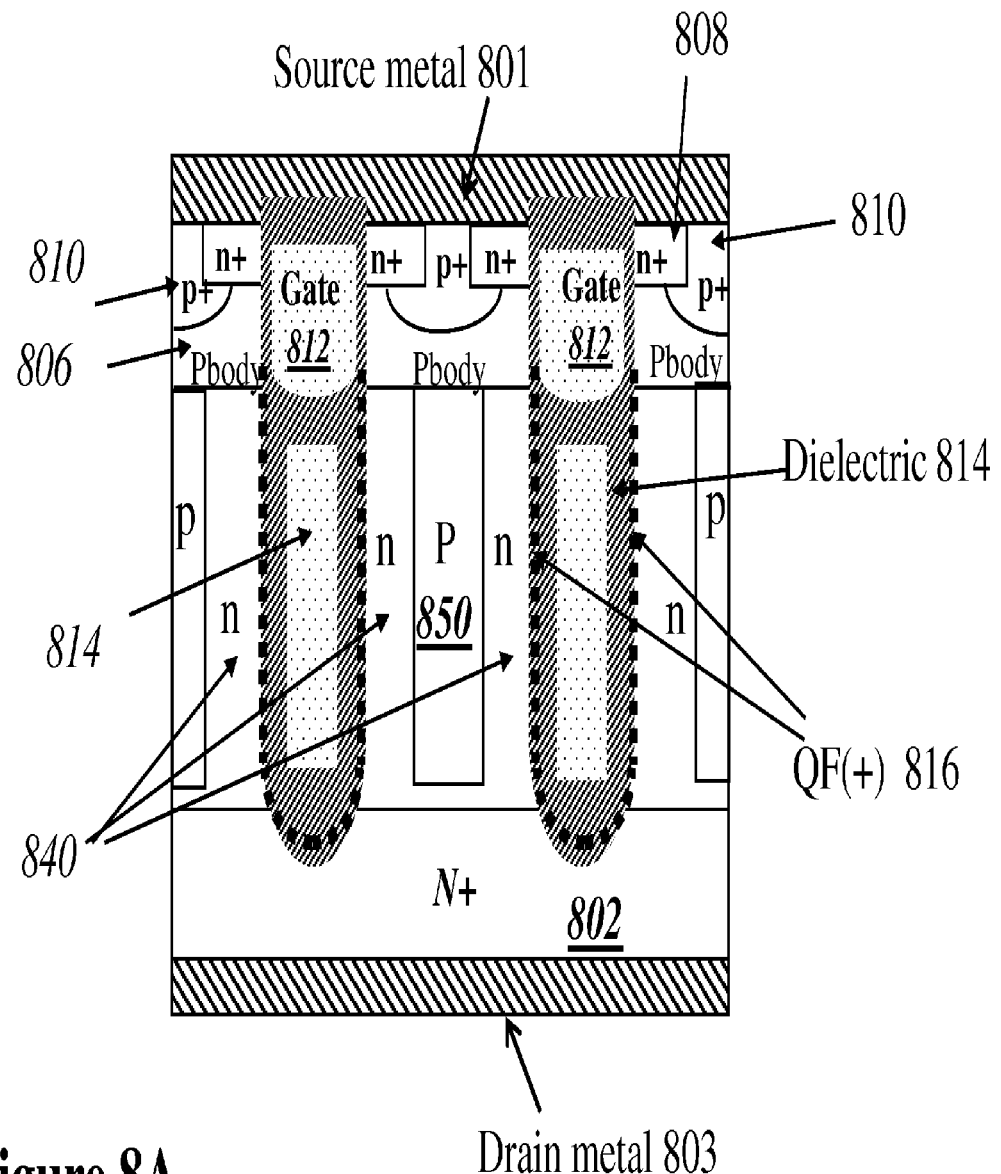
FIGS. 8A-8C show several examples of vertical trench MOS transistors with n-type columns, p-type columns and trenches filled with buried field plate and dielectric material containing permanent charge ($Q_F$), according to various disclosed innovative embodiments.

FIG. 8A shows one example of a trench MOSFET structure which is generally somewhat similar to that shown in FIG. 2, except that the P region 204 is replaced by n-columns 840 and p-columns 850. An insulated gate 812 and a buried or embedded field plate 821 inside a trench which is otherwise filled with dielectric 814. The gate electrode 812 can invert nearby portions of a p-type body region 806, which is contacted by a p+ body contact diffusion 810, and which also abuts an n+ source region 808. Positive permanent or fixed net electrostatic charge 816 is present near the trench sidewalls, and provides improved charge balancing of the p-columns 850 when depleted under reverse bias. Under these conditions the buried field plate electrode 821 causes the electric field to spread even more uniformly and hence a higher breakdown voltage. Furthermore, the buried field plate 821 helps to shield the gate electrode to reduce gate-drain capacitance Cgd. In the ON state the permanent charge forms an induced drift region by forming an electron accumulation layer along the interface between the oxide and the N-type layer 840. An adequate gate bias forms a channel region where excess electrons are present. Under these conditions electrons can flow from source 808, through the channel portion of p-type body region 806 and the combination of the accumulation layer and drift region 840. Source metallization 801 makes ohmic contact to source diffusion 808 and to p+ body contact region 810, and drain metallization 803 makes contact to the drain 802.

Figure 8B:
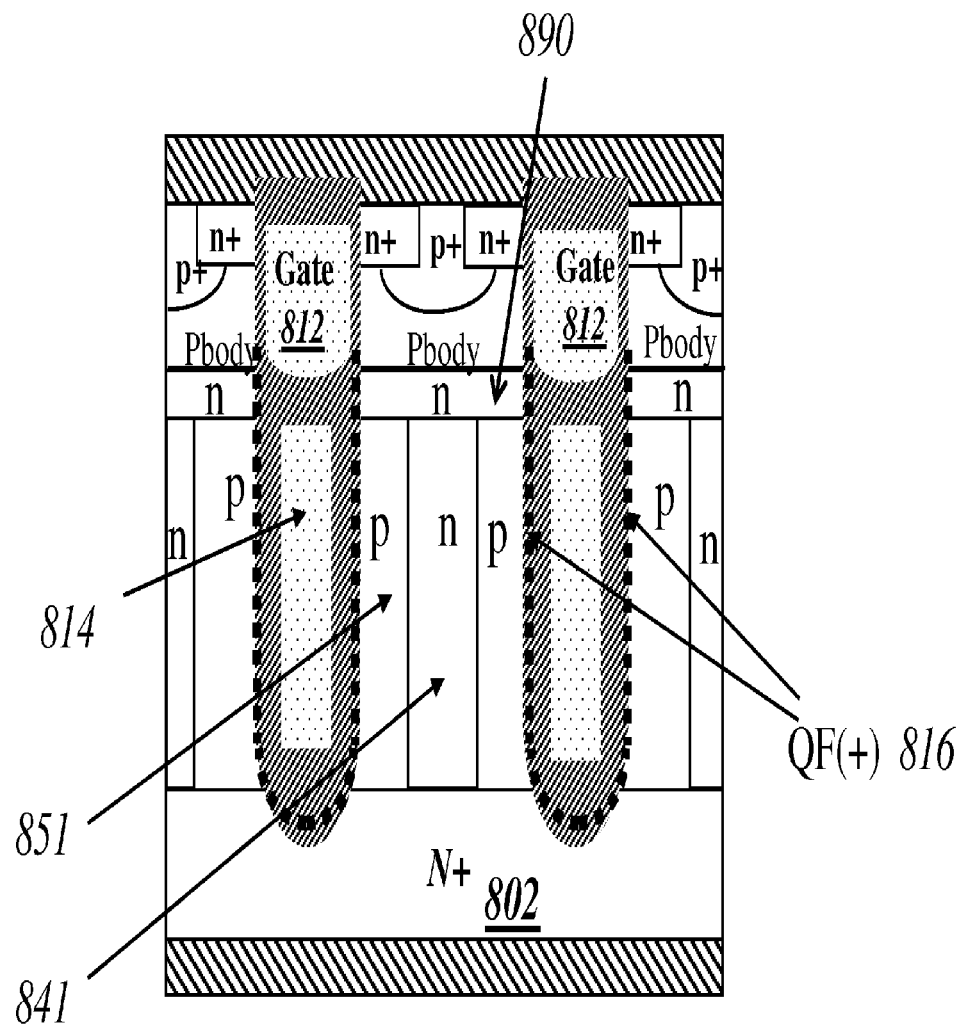

FIG. 8B shows another example of a trench MOSFET structure which is generally somewhat similar to that shown in FIG. 8A, except that the p-type columns 851 is adjacent to the trench and an additional n-layer 890. In the ON state the electron current flows from the channel through the inversion layer formed due to positive permanent charge. Furthermore, the n-layer 890 and n-columns 841 provide an additional current path and a lower $R_{SP}$ is achieved. In the OFF state between the positive depletion charge of the n-column 841 and permanent charge 816 is mainly balanced by the negative depletion charge of the p– column 851. In one example the doping concentration of the n-layer 890 is about 1e16 cm$^{-3}$, the n-column 841 is 5e15 cm$^{-3}$ and the p-type column 851 is 1.5e16 cm$^{-3}$.

Figure 8C:
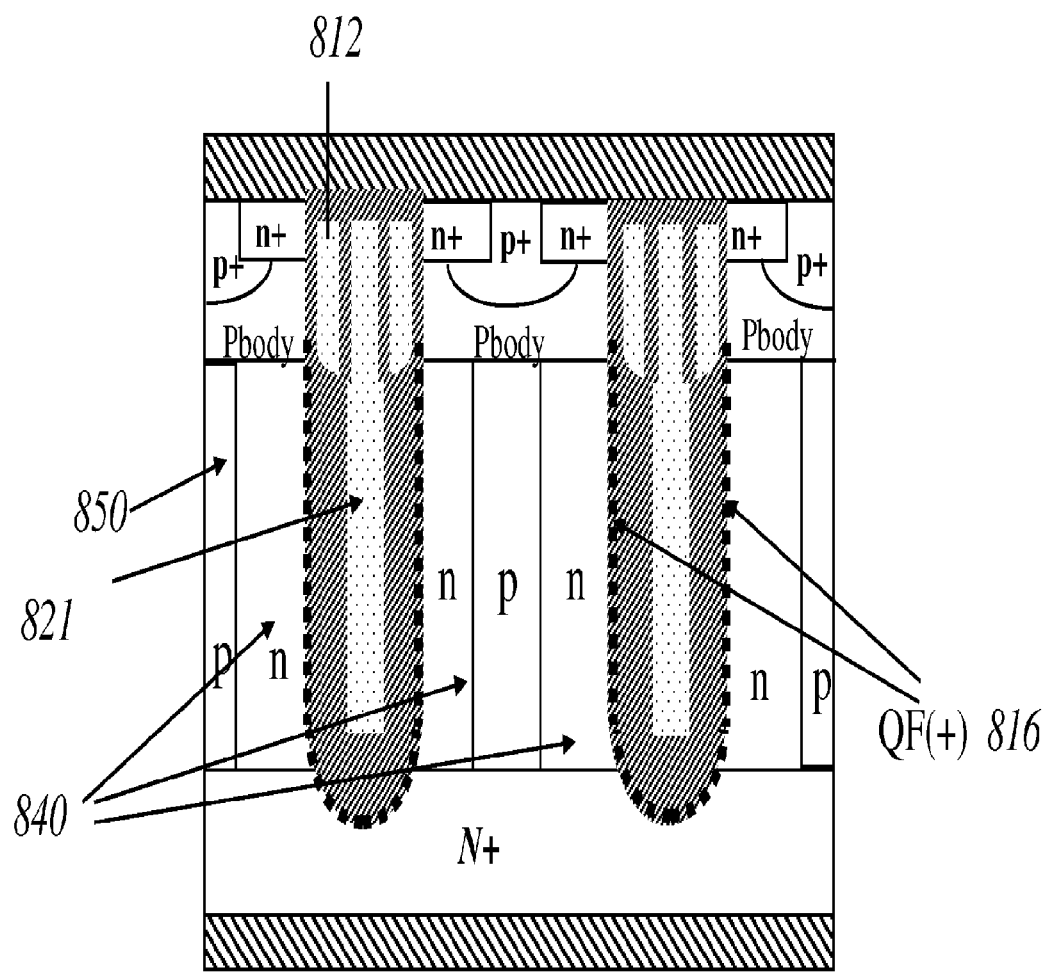

FIG. 8C shows yet another example of a trench MOSFET structure which is generally somewhat similar to that shown in FIG. 8A, except that the buried field plate electrode 821 extends upwards towards the surface and is surrounded by the gate electrode 812.

Figure 9A:
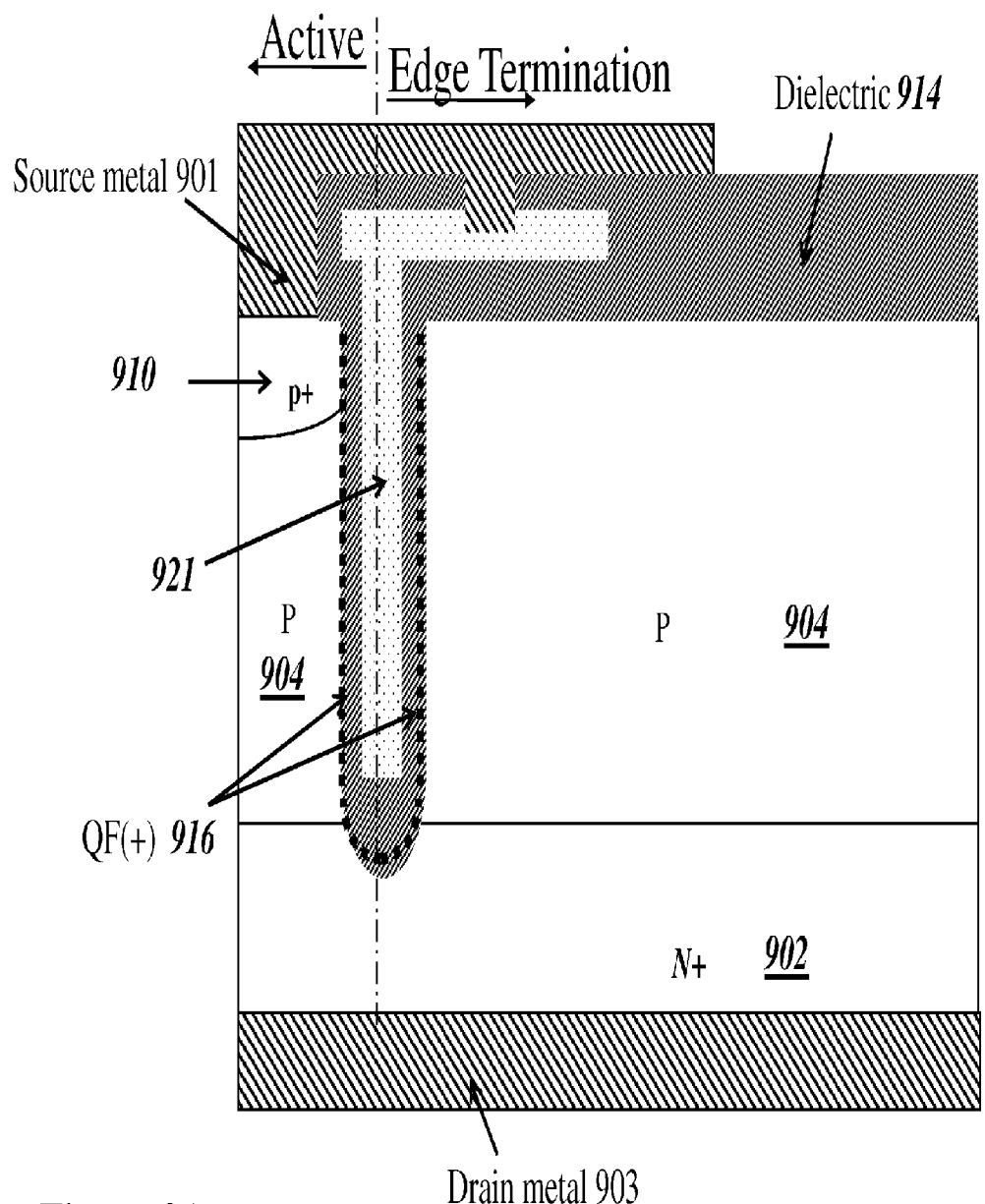
FIGS. 9A-9C show examples of termination structures using trenches filled with buried field plate and dielectric material containing permanent charge ($Q_F$), according to various disclosed innovative embodiments.
Figure 9B:
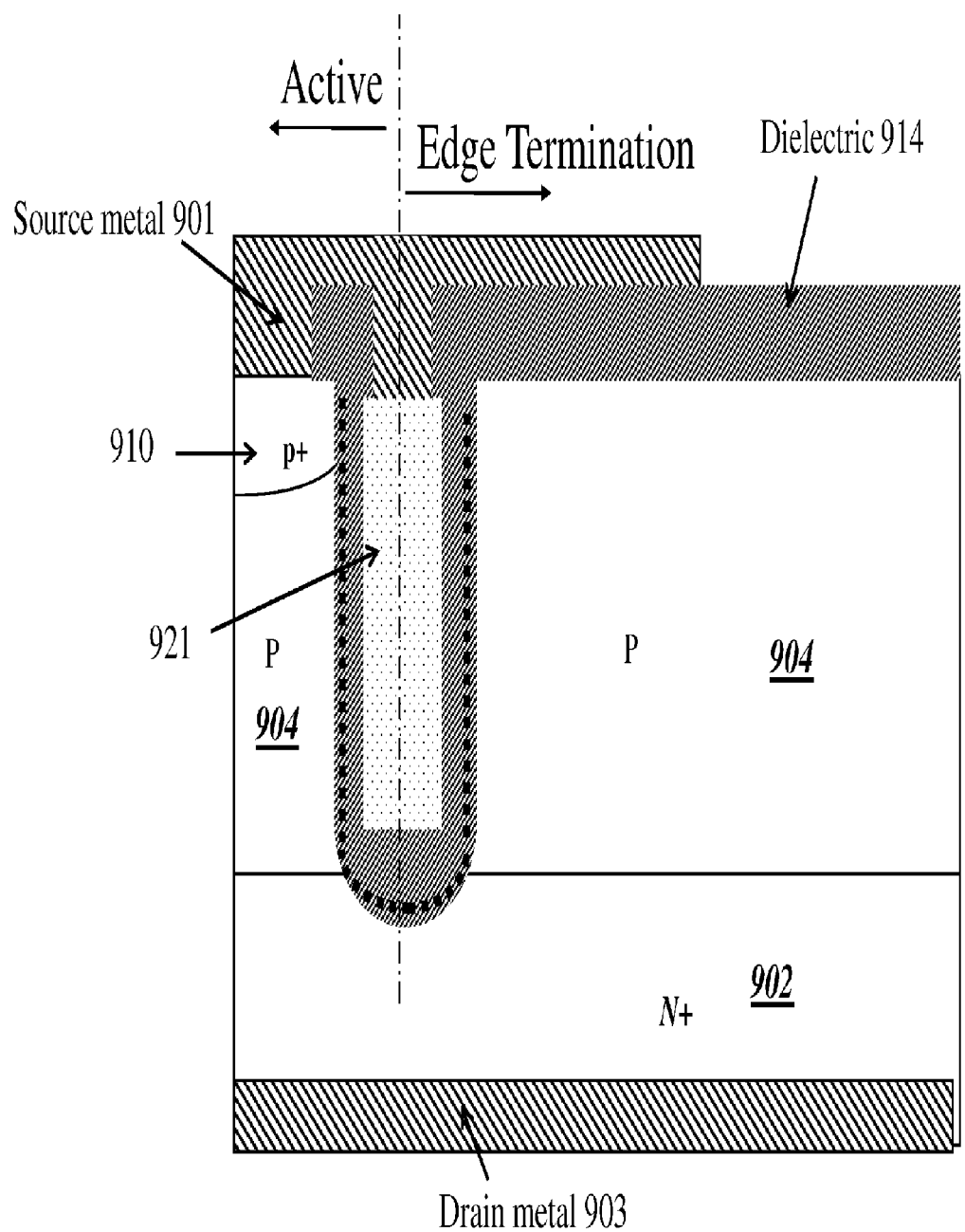
Figure 9C:
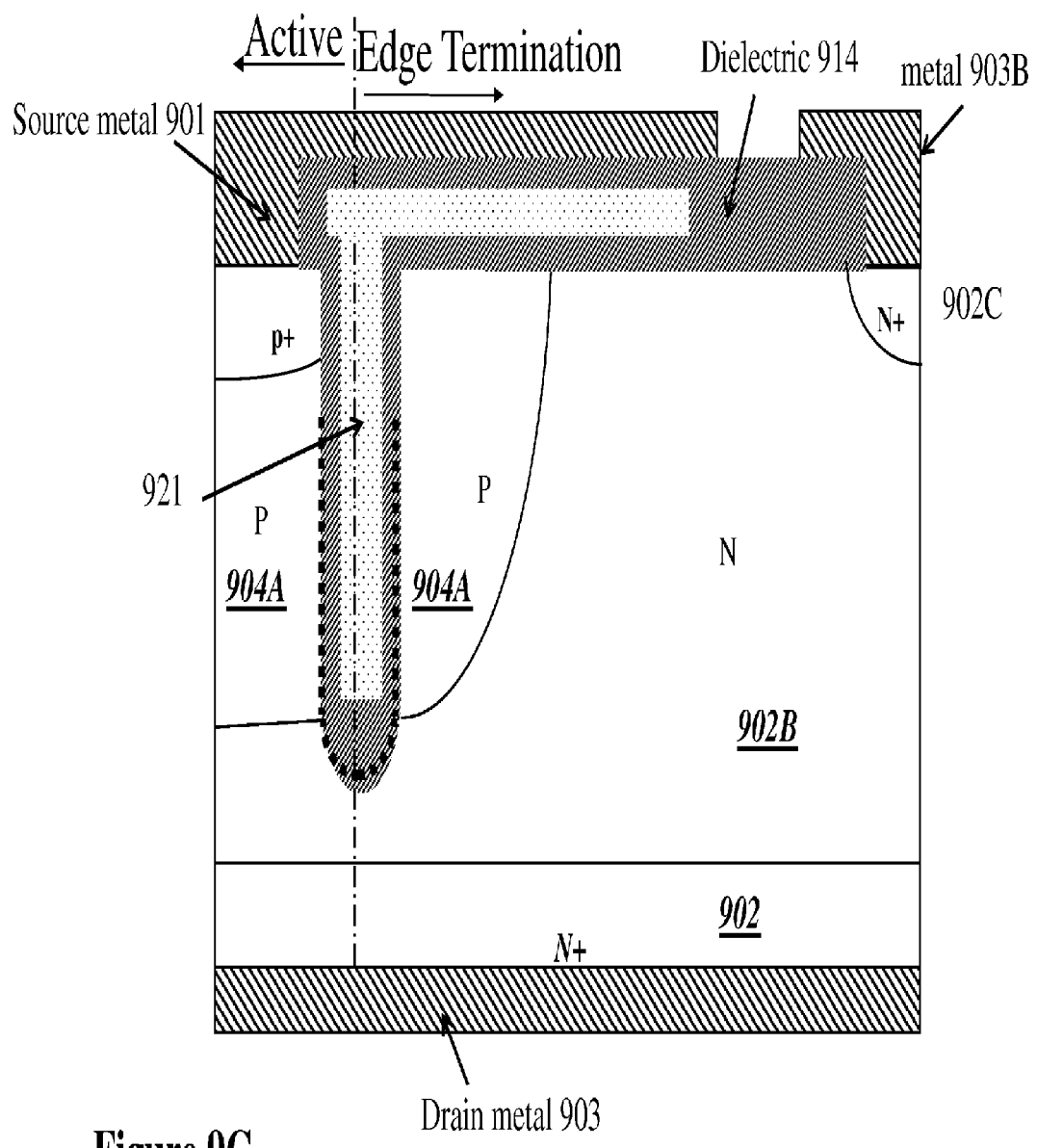

In addition, device edge or junction termination is needed and simple and area efficient edge termination structures are also disclosed in this application. The new termination structures are illustrated in FIG. 9A, FIG. 9B, and FIG. 9C. Dielectric layer such as silicon dioxide 914 covers the device surface and its thickness is chosen to support the required breakdown voltage. Positive permanent or fixed net electrostatic charge 916 is present near the trench sidewalls, and provides improved charge balancing when the epitaxial layer 904 is depleted under reverse bias. Under these conditions the buried field plate electrode 921 causes the electric field to spread even more uniformly. Furthermore, the buried field plate electrode 921 extends over the surface and forms a surface field plate. Source metal 901 forms an additional field plate and contacts p+ layer 910.

FIG. 9B shows another example of a termination structure which is generally somewhat similar to that shown in FIG. 9A, except that the source metal 901 contacts the buried field plate electrode 921 inside the trench.

FIG. 9C shows yet another example of a termination structure which is generally somewhat similar to that shown in FIG. 9A, except that the drift layer 904 is replaced by p-type well region 904A that is surrounded by epitaxial n-type epitaxial layer 902B.

Figure 10:
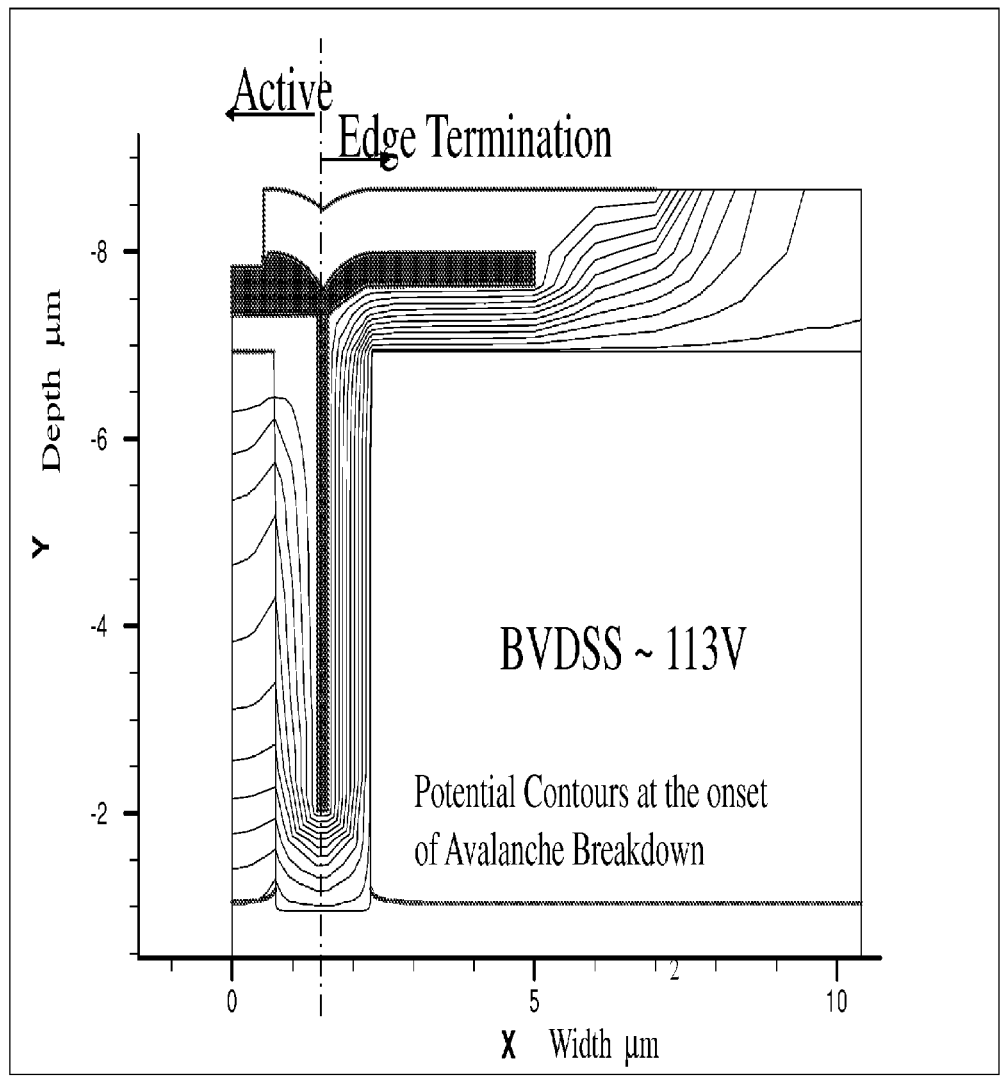
FIG. 10 shows two-dimensional device simulation results for the termination structure using buried field plate and dielectric material containing permanent charge ($Q_F$) shown in FIG. 9A.

The off-state blocking characteristics of the new edge termination structure shown in FIG. 9A have been simulated, and the results are shown in FIG. 10. The potential contours at the onset of the edge structures breakdown show that the new edge structure can terminate device junction in a very efficient manner, and the termination breakdown capability can be controlled by properly adjusting the permanent charge density $Q_F$.

According to some but not necessarily all implementations, there is provided: A semiconductor device, comprising: a current-controlling structure, which injects electrons into a p-type semiconductor drift region under some but not all conditions; a trench, abutting said drift region, which contains one or more conductive field plates, and which also contains immobile net electrostatic charge in a concentration sufficient to invert portions of said p-type drift region in proximity to said trench; and an n-type drain region underlying said drift region; wherein said immobile net electrostatic charge is present in a sufficient quantity that the peak electric field at breakdown, in the top one-third of the depth over which said field plates collectively extend, which is more than half of the peak electric field in the bottom one-third of the depth over which said field plates collectively extend.

According to some but not necessarily all implementations, there is provided: A semiconductor device, comprising: a current-controlling structure, which injects first-type charge carriers into a semiconductor drift region under some but not all conditions; a trench, abutting said drift region, which contains one or more conductive field plates, and which also contains immobile net electrostatic charge; and an n-type drain region underlying said drift region; wherein said immobile net electrostatic charge is present in a sufficient quantity that, in said drift region at breakdown, the voltage drop across the top one-third of the vertical extent of said field plates collectively is more than one-third of the voltage drop across the bottom one-third of the depth over which said field plates collectively extend.

According to some but not necessarily all implementations, there is provided: A semiconductor device, comprising: a current-controlling structure, which injects electrons into a p-type semiconductor drift region under some but not all conditions; a trench, abutting said drift region, which contains one or more conductive field plates, and which also contains immobile net electrostatic charge in a concentration sufficient to invert portions of said p-type drift region in proximity to said trench; and an n-type drain region underlying said drift region; wherein the minimum cross-sectional area of said field plate(s) is more than 25% of the minimum cross-sectional area of said trench in proximity to said drift region.

According to some but not necessarily all implementations, there is provided: A semiconductor device, comprising: a current-controlling structure, which injects first-type charge carriers into a semiconductor drift region under some but not all conditions; a trench, abutting said drift region, which contains one or more conductive field plates, and which also contains immobile net electrostatic charge of at least 5E10 cm$^{-2}$; wherein said field plates collectively have a vertical extent which is more than 50% of that of said trench in proximity to said drift region.

According to some but not necessarily all implementations, there is provided: A semiconductor device, comprising: a current-controlling structure, which injects first-type charge carriers into a semiconductor drift region under some but not all conditions; a trench, abutting said drift region, which contains one or more conductive field plates, and which also contains immobile net electrostatic charge of at least 5E10 cm$^{-2}$; wherein said field plates collectively have a volume which is more than 50% of that of said trench in proximity to said drift region.

According to some but not necessarily all implementations, there is provided: A semiconductor device, comprising: a current-controlling structure, which injects electrons into a p-type semiconductor drift region under some but not all conditions; a trench, abutting said drift region, which contains at least one conductive field plates, and which also contains immobile net electrostatic charge in a concentration sufficient to invert portions of said p-type drift region in proximity to said trench; and an n-type drain region underlying said drift region; wherein said field plate has sidewalls which are predominantly vertical and parallel to a sidewall of said trench.

According to some but not necessarily all implementations, there is provided: A semiconductor device, comprising: an n-type source, a p-type body region, and an insulated gate electrode which is capacitively coupled to invert portions of said body region and thereby inject electrons into a semiconductor drift region; a trench, abutting said drift region, which contains one or more conductive field plates, and which also contains immobile net electrostatic charge; and an n-type drain region drain region, which is separated from said body by said drift region; wherein said immobile net electrostatic charge is present in a sufficient quantity that, at breakdown, the voltage drop across the one-third of said drift region nearest said source region is more than one-third of the voltage drop across the one-third of said drift region nearest said drain.

According to some but not necessarily all implementations, there is provided: A method of operation of a power semiconductor device, comprising: in the ON state, applying a voltage to a gate electrode to thereby permit injection of majority carriers from a first-conductivity-type source region, by inverting a portion of a second-conductivity-type body region, into a second-conductivity-type drift region, which is partially inverted by immobile electrostatic charge in a trench which adjoins said drift region; and wherein, in the OFF state, an insulated field plate, which is present in said trench, is capacitively coupled to said drift region to thereby result in a first locally maximal electric field near a bottom corner of said field plate, and said immobile electrostatic charge at least partially balances the space charge of depleted portions of said drift region, and augments a second locally maximal electric field near a top corner of said field plate.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For one example, the disclosed teachings can also be implemented in lateral semiconductor devices. In this case the density of fixed charge $Q_F$ is preferably graded laterally. This can be done, for example, by implanting through a tapered layer, or by using a process which includes some lateral erosion of photoresist or other patterned layer.

The above descriptions of charge balance assume that the background doping of the semiconductor material is constant at a given depth, but this too is another device parameter which can be adjusted.

For example, the disclosed inventions can also be applied to processes where doping is laterally outdiffused from trenches.

Furthermore, in other embodiments the P epitaxial region can be replaced by an implanted or diffused P-well region.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way.

While only n-channel MOSFETs are shown here, p-channel MOSFETs are realizable with this invention simply by changing the polarity of the permanent charge and swapping n-type and p-type regions in any of the figures. This is well known by those of ordinary skill in the art.

It should be noted in the above drawings the positive and permanent charge was drawn for illustration purpose only. It is understood that the charge can be in the dielectric (oxide), at the interface between the silicon and oxide, inside the silicon layer or a combination of all these cases.

It is understood by those of ordinary skill in the art that other variations to the above embodiments can be realized using other known termination techniques.

It is also understood that this invention is also valid if the opposite polarity of the permanent electrostatic charge, i.e. negative charge, and the opposite semiconductor conductivity types are used.

It is also understood that numerous combinations of the above embodiments can be realized.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be synergistically with the inventions claimed below, may be found in the following US patent applications. All of these applications have at least some common ownership, copendency, and inventorship with the present application: All of these applications, and all of their priority applications, are hereby incorporated by reference: US20080073707; US20080191307; US20080164516; US20080164518; US20080164520; US20080166845; US20090206924; US20090206913; US20090294892; US20090309156; US20100013552; US20100025726; US20100025763; US20100084704; US20100219462; US20100219468; US20100214016; US20100308400; US20100327344; and unpublished U.S. application Ser. Nos. 12/431,852; 12/369,385; 12/720,856; 12/759,696; 12/790,734; 12/834,573; 12/835,636; 12/887,303; and Ser. No. 12/939,154. Applicants reserve the right to claim priority from these applications, directly or indirectly, and therethrough to even earlier applications, in all countries where such priority can be claimed.

The claims as filed are intended to be as comprehensive as possible, and NO subject matter is intentionally relinquished, dedicated, or abandoned.

What is claimed is:

1. A semiconductor device, comprising:
a current-controlling structure, which injects electrons into a p-type semiconductor drift region under some but not all conditions; said current-controlling structure including an n-type source region, an insulated field-effect transistor gate electrode which is capacitively coupled to selectably invert a portion of a p-type body region to thereby form a horizontal channel therein;
a trench, abutting said drift region, which contains one or more conductive field plates, and which also contains immobile net electrostatic charge in a concentration sufficient to invert portions of said p-type drift region in proximity to said trench; and
an n-type drain region, which is separated from said current-controlling structure by said drift region;
wherein said immobile net electrostatic charge is present in a sufficient quantity that the electric field at breakdown, within the top one-third of the depth over which said field plates collectively extend, is more than half of the electric field in the bottom one-third of the depth over which said field plates collectively extend.

2. The device of claim 1, further comprising a patterned electrode which is substantially coplanar with the gate electrode but not connected thereto, and which overlies and makes contact with the conductive field plates.

3. The device of claim 1, wherein said drift region consists essentially of silicon.

4. The device of claim 1, wherein each said trench includes only one said field plate.

5. The device of claim 1, comprising a plurality of said trenches.

6. The device of claim 1, wherein said field plate is heavily doped polysilicon.

7. The device of claim 1, wherein said field plate is insulated from said drift region by silicon dioxide.

8. The device of claim 1, wherein said drift region includes paralleled p-type and n-type regions.

* * * * *